(12) United States Patent
Nazarian et al.

(10) Patent No.: US 9,727,258 B1
(45) Date of Patent: Aug. 8, 2017

(54) TWO-TERMINAL MEMORY COMPATIBILITY WITH NAND FLASH MEMORY SET FEATURES TYPE MECHANISMS

(71) Applicant: Crossbar, Inc., Santa Clara, CA (US)

(72) Inventors: Hagop Nazarian, San Jose, CA (US); Kuk-Hwan Kim, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 140 days.

(21) Appl. No.: 14/642,205

(22) Filed: Mar. 9, 2015

Related U.S. Application Data

(60) Provisional application No. 62/059,774, filed on Oct. 3, 2014.

(51) Int. Cl.
*G06F 3/06* (2006.01)

(52) U.S. Cl.
CPC .......... *G06F 3/0619* (2013.01); *G06F 3/0659* (2013.01); *G06F 3/0688* (2013.01)

(58) Field of Classification Search
CPC ..... G06F 3/0619; G06F 3/0659; G06F 3/0688
See application file for complete search history.

(56) References Cited

U.S. PATENT DOCUMENTS

| | | | |
|---|---|---|---|
| 8,250,282 B2 | 8/2012 | Confalonieri et al. | |
| 2008/0306723 A1* | 12/2008 | De Ambroggi | G11C 11/005 703/21 |
| 2009/0158918 A1* | 6/2009 | Norman | G11C 5/04 84/603 |
| 2009/0248962 A1 | 10/2009 | Kim et al. | |
| 2010/0218073 A1 | 8/2010 | Kang et al. | |
| 2011/0128766 A1* | 6/2011 | Parkinson | G11C 7/10 365/63 |
| 2011/0188282 A1* | 8/2011 | Chevallier | G11C 5/02 365/51 |
| 2012/0020142 A1* | 1/2012 | Yu | G11C 8/10 365/148 |
| 2012/0137058 A1 | 5/2012 | Hanzawa | |
| 2012/0155162 A1 | 6/2012 | Hanzawa | |
| 2012/0208595 A1* | 8/2012 | Norman | G06F 12/0238 455/556.2 |
| 2013/0279246 A1* | 10/2013 | Lee | G11C 13/0004 365/163 |
| 2015/0074486 A1 | 3/2015 | Gaertner et al. | |
| 2016/0062656 A1* | 3/2016 | Ramaraju | G11C 16/10 711/103 |

OTHER PUBLICATIONS

Intel Corporation, Open NAND Flash Interface Specification, Apr. 2, 2014.*
Office Action dated Oct. 12, 2016 for U.S. Appl. No. 14/641,878, 32 pages.
Office Action dated Feb. 2, 2017 for U.S. Appl. No. 14/641,878, 26 pages.

* cited by examiner

*Primary Examiner* — Ryan Bertram
(74) *Attorney, Agent, or Firm* — Amin, Turocy & Watson, LLP

(57) ABSTRACT

Operating characteristics associated with NAND flash memory can be modified and/or emulated to support corresponding operating characteristics for two-terminal memory. As a result, NAND flash memory modules included in conventional NAND flash memory devices (e.g., memory cards, solid-state drives, etc.) can be replaced with two-terminal memory without substantial changes to manufacturing infrastructure associated with the manufacture of these NAND flash memory devices.

29 Claims, 12 Drawing Sheets

EXAMPLE FEATURE PARAMETER DEFINITIONS 200

| Feature Address | Description |
|---|---|
| 00h | Reserved |
| 01h | Timing Mode |
| 02h | NV-DDR2/NV-DDR3 Configuration |
| 03h-0Fh | Reserved |
| 10h | I/O Drive Strength |
| 11h-2Fh | Reserved |
| 30h | External Vpp Configuration |
| 31h-4Fh | Reserved |
| 50h | EZ NAND Control |
| 51h-57h | Reserved |
| 58h | Volume Configuration |
| 59h-5Fh | Reserved |
| 60h | BA NAND: Error Information |
| 61h | BA NAND: Configuration |
| 62h-7Fh | Reserved |
| 80h-FFh | Vendor Specific |

FIG. 2

TWO-TERMINAL MEMORY COMPATIBILITY WITH NAND FLASH MEMORY SET FEATURES TYPE MECHANISMS

CROSS-REFERENCE TO RELATED APPLICATION(S)

The subject application claims the benefit of U.S. Patent Application Ser. No. 62/059,744, entitled "TWO-TERMINAL MEMORY COMPATIBILITY WITH OR ENHANCEMENT TO NAND FLASH MEMORY SET FEATURES TYPE MECHANISMS" and filed Oct. 3, 2014, which is incorporated by reference herein its entirety and for all purposes.

TECHNICAL FIELD

This disclosure generally relates to providing compatibility for or enhancement to Get Feature or Set Feature operations associated with identifying or configuring NAND flash memory operating characteristics in connection with (non-NAND) two-terminal memory.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for a two-terminal memory device configured to be programmed to one of a set of operational states, post-fabrication. In some embodiments, the two-terminal memory device can be programmed to an operational state configured to emulate NAND-based memory. Emulation of NAND-based memory with two-terminal memories enables various advantages of two-terminal memory to be realized by a NAND-based memory device, with little or no reprogramming of the NAND-based memory. In some embodiments, the two-terminal memory device can be programmed to operate with a host controller natively designed for a two-terminal memory device, disabling emulation of NAND, to provide most or all of the advantages of two-terminal memory. In other embodiments, a two-terminal memory device can be programmed to emulate native NAND operations by NAND Get/Set Features capabilities, including post-fabrication programming to operate according to one or more modes of operation, programming to operate according to a vendor-specific mode of operation, and others. NAND emulation can include implementing read, write or erase operations according to NAND specifications, while still utilizing configurable page size capabilities of two-terminal memory. Various embodiments therefore improve access times, lower power consumption, or the like, among others Devices disclosed herein relate to a NAND-based memory device (e.g., a memory card, solid-state drive, etc.) comprising one or more memory modules. Memory module(s) can include an array of non-volatile two-terminal memory cells that have different operating characteristics from conventional NAND flash memory. The memory device can further comprise a module controller and translator (MCT) that can be configured to set two-terminal memory operational characteristics for the one or more memory modules. Setting these two-terminal memory operational characteristics can be in response to a configuration command for setting a NAND operational characteristic for NAND flash memory.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 2 depicts an example illustration of example Feature parameter definitions that are provided and/or relate to NAND flash memory devices in accordance with certain embodiments of this disclosure.

DETAILED DESCRIPTION

Introduction

Figure 1:
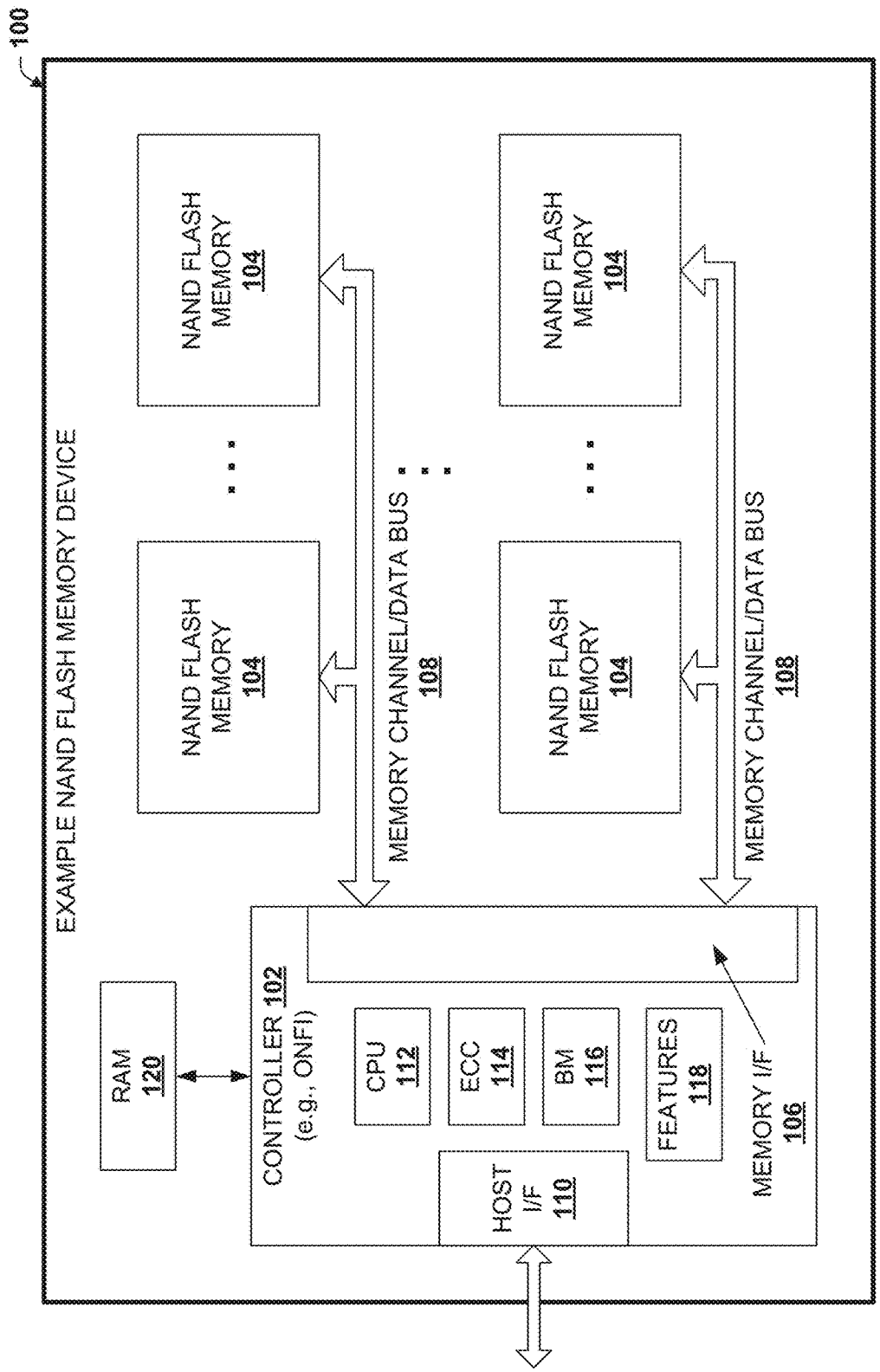
FIG. 1 illustrates a block diagram of an example NAND flash memory device in accordance with certain embodiments of this disclosure.

Embodiments of this disclosure relate to mechanisms for setting operational characteristics of memory arrays. For example, such mechanisms can emulate existing NAND flash memory Set Features functions or provide other operational characteristic modification that can be tailored for non-NAND two-terminal memory.

NAND flash memory is a non-volatile computer storage medium utilized to store information for computing devices such as personal computers, laptops, smart phones, cameras, gaming consoles and so on. Since NAND flash memory is non-volatile, NAND flash memory is primarily used for memory cards, removable memory devices, solid-state drives or the like, but is also used in some applications or computing devices as main memory or other applications typically associated with volatile memory.

The inventor(s) of the subject disclosure view flash memory technology as having two primary distinct logical architectures, the NAND architecture and the NOR architecture, both based on different arrangements of semiconductor transistors. Each of the logical architectures has different attributes, including advantages and drawbacks, with respect to the other. NAND is the most commonly used in consumer memory applications, largely because of its memory density and low cost.

As previously introduced, NAND flash memory is employed for compact devices, USB devices, SD cards, solid state drives (SSDs), and storage class memory, as well as other form-factors. NAND has proven a successful technology. As technology has scaled down below 72 nanometer (nm) memory cell technology for NAND, the inventor(s) of the present application believe that structural and electrical problems will arise. For instance, bit error rates (BERs) will increase significantly, while memory cycling (related to memory endurance) will decrease.

In addition to difficulties associated with scaling to smaller technologies, NAND flash memory has some inherent drawbacks as well. NAND flash memory is architecturally divided into blocks with storage capacity generally on the order of a few megabytes (MB). Each block is divided into pages that are addressed by individual wordline operations. A block can include many pages (e.g., 128, 256, etc.), each of which can be, for example, 512 bytes or more. One limitation of NAND flash memory technology is that programming or writing data is performed at the page level, i.e., to change any single data bit on a page, an entirely new page of data (with the changed bit) has to be written into the NAND memory. Another limitation with NAND memory is that erasing data must occur at the block level, i.e., to erase any single data bit within a block, every single bit within the entire block of data has to be erased for the NAND memory. In this regard, a page of memory (e.g., memory cells connected to a single global wordline of a memory device, e.g., four kilobytes (kB)) cannot be directly altered or rewritten without first erasing an entire block of the memory that may include hundreds of pages of data. Furthermore, multiple block-processes are involved in rewriting the page of memory. As an example, altering a page of memory can involve first backing up the block of data in which the page of memory resides, next erasing the block, and then writing the backed-up data—including revisions to the page of memory—back to the block of data. As this example illustrates, NAND flash memory cannot be updated without first being erased, regardless of memory granularity (e.g., block, page, word, byte, bit, etc.).

With some NAND memories, to continue the above page overwrite example, reducing program/erase (P/E) cycles for the block of memory can involve writing the backed-up data with revisions to the page of memory to a second block of memory, other than the block in which the page resides. In other words, the revised block of data is simply written to a different block. Such cases involve writing to only one block of memory, while removing the erase process to the first block. It reduces at least overall memory operations involved in overwriting the page of memory from two block operations (e.g., erasing the block, re-writing the block), to one block operation (e.g., writing to the second block). However, if the first block is to be used later, then it must be erased, typically in connection with garbage collection procedures. In this case, a logical to physical (L2P) mapping table is maintained and updated by a memory controller to keep track of the new location of the backed-up data with revisions. A drawback is that the L2P mapping increases controller overhead, including memory and processes, and increases requisite controller circuitry.

In addition to the foregoing, NAND flash memory does not generally have a high program/erase (P/E) cycle count before degradation. As a result, NAND devices often incorporate wear leveling schemes to reduce P/E cycles for a given block(s) of memory, or spread the P/E cycles among most or all blocks of a memory device. The wear-leveling algorithm attempts to equalize a number of P/E cycles across respective blocks of memory for a NAND device. This can be implemented independent of host operating commands and file system operations. An efficient wear-leveling algorithm attempts to maintain a low P/E cycle differential between the highest cycled block of memory and the lowest cycled block of memory. Drawbacks of the wear-leveling algorithm are also added computational and management overhead as well as additional circuitry-based components.

In addition to the overhead added by wear-leveling algorithms and L2P mapping, garbage collection algorithms are commonly employed with NAND flash memory devices, particularly for smaller technology nodes that have lower endurance (e.g., P/E cycle wear capacity). In these cases, wear leveling and garbage collection algorithms are essential to increase the perceived endurance cycles. Re-writing pages or blocks of data to other locations on a chip leaves the original location with residual data. After many rewrites, whether due to host commands or wear-leveling, a significant number of blocks or pages of memory can be left with residual data. Because many NAND flash memory devices cannot overwrite memory cells without first erasing them, the garbage collection algorithms are designed to free up these pages or blocks of data by erasing them at opportune times, so that new data can be written to them.

For NAND flash memory, a write process, as well as garbage collection and wear-leveling, often involve multiple P/E cycles. The number of P/E cycles is related to a memory characteristic called write amplification (WA). WA can be viewed as a measure of efficiency of a memory controller, and is generally defined by characteristics of a memory device and of a memory controller associated with the memory device. More particularly, WA refers to a number of memory controller write processes involved in executing a single host write command to the memory. Assuming no compression, the inventors believe an ideal WA is one, which indicates a single memory controller write process for each host write command. In contrast, NAND flash memory often has a WA between three and four, reflecting the lack of direct overwrite capability and the fact that program is provided at the page level whereas erasing is performed at the block level. Because memory reliability and life are affected by increasing P/E cycles, the WA of a memory device directly affects reliability and performance of a memory device.

Yet another factor impacting storage system performance and overhead is decreasing memory cell retention, and corresponding increase in "bit error rate" (BER). As mentioned above, as semiconductor transistor technology has decreased in size (e.g., from 72 nm nodes to 20 nm nodes) there has been a correlated decrease in memory retention and increase in BER. The increased BER places further demand on error correction code (ECC) requirements for NAND flash memory. This increase in ECC demand results in an increasing number of ECC corrections for a given size memory (e.g., 1 kB), which correlates to an increase in a number of chip transistors, process cycles and power consumption associated with ECC. Further exacerbating this problem is the incorporation of more powerful digital signal processing with advanced ECC algorithms (e.g., low density parity check (LDPC) codes). These codes can increase effectiveness of ECC corrections, but significantly adds overhead and power consumption to the components of the storage memory system. The inventor(s) of the subject disclosure are of the opinion that the memory device requires more spare memory to accommodate the increased ECC demand, the controller requires more transistors, and the system requires larger capacity DRAM elements. Furthermore, the efficiency of LDPC is a sub-linear function with respect to the number of errors. Increased BER, therefore, decreases the efficiency of LDPC, and at a certain threshold LDPC becomes unfeasible such that other less sophisticated or less efficient ECC algorithms are required to relieve the increasing overhead.

In addition to the memory retention, device longevity and system overhead challenges discussed above, NAND flash memory storage systems have inherent slow page read speeds relative to other types of memories. A typical read speed for many NAND flash memory products is about 25 µs. This latency may not be suitable for newer applications, such as enterprise storage, real-time embedded memory applications, or the like. For instance, in these and other memory applications, sub-100 ns read access times are preferred. The relatively low read current of NAND flash memory (e.g., less than about 300 nanoamps (nA)) poses a problem for improving read times of this technology. Moreover, the memory architecture of NAND flash memory incorporates some inherent challenges to fast random read operation.

NAND flash memory has been a dominant technology in portable memory storage devices over recent years. The ability to effectively scale in node size, in conjunction with fast write and erase speeds, fairly good longevity and manufacturing has made NAND flash memory the most popular removable storage device in commercial and consumer markets. Though NAND flash memory has met the demand for scalability for up to 20 nm technologies, the inventor(s) of the subject application believe that other technologies will need to be developed to replace conventional NAND flash memory and other floating gate-operated transistors employed for memory applications, particularly at and below the 20 nm cell technology.

To these and related ends, the subject disclosure relates to achieving advantages that can be realized by replacing NAND flash memory that is conventionally used for computing devices with non-volatile two-terminal memory. Furthermore, various embodiments provide for post-fabrication programming (e.g., through Set Feature standards) configured to enable or disable emulation of NAND operations, with a two-terminal memory chip. The post-fabrication programming can enable a two-terminal memory chip to interface with a NAND-compliant system, when programmed to emulate NAND, and to interface to a two-terminal memory system, when programmed to operate in conjunction with two-terminal memory.

Examples of the two-terminal memory technology include resistive memory (e.g., resistive-switching memory cell), ferromagnetic memory, phase change memory, magneto-resistive memory, organic memory, conductive bridging memory, and so on. Advantageously, two-terminal memory technology can facilitate writing to and rewriting to a memory location without first erasing a block of memory in which the memory location resides. In some embodiments, a two-terminal memory chip configured to emulate NAND can respond to block erase, page write or page read commands at least in part by rewriting underlying two-terminal memory that is emulating NAND. Hence, a well-known limitation associated with NAND flash memory can be mitigated or avoided entirely by various embodiments described herein. In some aspects of the subject disclosure, disclosed memory devices can write to the memory location without first erasing the memory location. Accordingly, such memory devices can avoid garbage collection algorithms and the associated overhead costs associated with implementing a NAND program command. In addition, these memory devices can provide non-compression WA value as low as one, the ideal WA value for storage systems. Thus, another well-known limitation associated with NAND flash memory can be mitigated.

Emulating NAND flash memory of computing devices, either wholly or in part, with two-terminal memory can lead to additional advantages. For example, memory devices comprising two-terminal memory arrays can provide faster read (e.g., page read) characteristics. In at least one embodiment, a read speed of memory cells employed for the disclosed memory devices can be about 30 ns to about 1 μs. Furthermore, the memory devices can have low BER, high endurance and robust cycling characteristics, alleviating constraints on ECC and wear-leveling algorithms and reducing controller overhead and power consumption. In various embodiments, the two-terminal memory technology provided for the disclosed memory can have a memory retention of about ten years or more (e.g., at 85 degrees Celsius), and cell endurance of about $1 \times 10^8$ P/E cycles. In still other embodiments, the two-terminal memory technology can readily scale down to 5 nm nodes, though the subject disclosure is not limited to two-terminal memory technology having this scalability, all of which represent significant advantages over NAND flash memory.

Previously, computing devices such as phones, tablets, etc, (e.g., a host) accessed the NAND flash memory chips via high-level instructions. For example, a host device operating system (OS) or an associated file system architecture transmits the high-level instruction to an interface associated with the memory chips. In most cases, the board or physical memory device comprising NAND flash memory elements also includes a controller that, inter alia, operates the interface and translates this high-level instruction to one or more low-level instructions that are used to directly act on the NAND flash memory. Due to the wide variety of applications for NAND flash memory, a diversity of manufacturers, and the ubiquitous nature of NAND flash memory devices, standards arose for the low-level interface to the physical memory chips.

The most widely used standard is known as Open NAND Flash Interface Working Group (ONFI) developed by a consortium of NAND flash memory vendors and other parties. ONFI specification 4.0 was released Apr. 2, 2014 and is incorporated herein by reference. Another standard is known as Toggle Mode NAND, developed by one particular NAND flash memory manufacturer. Such standards are employed by the controller, e.g., for standardizing translation of high level instructions to low-level instructions associated with reading, writing, and erasing data stored on the NAND flash memory; for standardizing a physical (e.g., pinouts) interface; and for setting/identifying operating characteristics associated with the NAND flash memory device.

Setting operating characteristics of the NAND flash memory device can provide certain advantages. For example, a memory device that operates at a high power or timing setting might achieve a high level of performance. That same memory device might instead be set to achieve a lower level of performance but as a trade-off operate at lower power consumption. Therefore, a single memory device can be manufactured in large quantities to suit the needs of many different host devices by simply varying the operating characteristic settings.

ONFI specifies several standard operating modes, any one of which can be selected as a default (e.g., a default operating mode on power-on) by a manufacturer. This enables the manufacturer to provide NAND chips created by a single fabrication process, to operate in different program modes. For instance, a NAND chip can be used with different mode settings to serve the program presumptions, operational specifications or preferences of host devices in terms of timing or the like, which can affect read times, write times, power consumption, and so forth associated with the memory device. Typically, the mode is tailored and set by the manufacturer prior to shipping to a customer of the memory device.

In addition, ONFI provides "Get Features" and "Set Features" functions. The Get Features function is the mechanism the host uses to determine the current settings for a particular feature (e.g., operating characteristic of the NAND flash memory). This function shall return the current settings for the feature (including modifications that may have been previously made with the Set Features function). The Set Features function modifies the setting of a particular feature. For example, this function can be used to enable a feature that is disabled at power-on. Set Features is used to change operating characteristics such as the timing mode, data interface type, I/O drive strength, external voltage configuration, etc., any of which can be configured by accessing a designated feature addresses. Additionally, a set of feature addresses are allocated to vendor specific operational characteristics.

The inventor(s) believe that emulating conventional NAND flash memory with embodiments of the disclosed two-terminal memory can yield significant advantages in terms of both existing arrangements and future improvements. The inventor(s) also believe that transition away from NAND flash memory to two-terminal memory can be simplified or further encouraged by providing programmable compatibility with NAND flash memory controllers. Existing NAND flash memory devices typically comprise NAND flash memory and an associated on-board controller (usually compliant with ONFI or some other standard) and other elements. By providing a two-terminal memory chip that can be programmed to operate with existing NAND controllers (e.g., as specified by ONFI), NAND flash memory can be replaced with two-terminal memory without changes to the controller or other elements of the memory device. Accordingly, transition to two-terminal memory can be accomplished with minimal re-tooling, controller re-programming or other impacts on memory device manufacturers.

Additionally or alternatively, programmable modalities can facilitate post-fabrication customizable memory characteristics for a two-terminal memory chip. For instance, in some embodiments, the programmable modalities can enable a two-terminal memory chip to satisfy vendor specific operational characteristics provided in connection with ONFI (or another) specification. Vendor specific operational characteristics might include, for example, software or hardware performance settings tailored to take advantage of two-terminal memory implementations, performance settings matched to associated hardware characteristics or logical presumptions of a host device (e.g., a smart phone, tablet computer, wearable device, etc), or the like, or suitable combinations of the foregoing. Such vendor specific functions, as with other feature parameters, can be configured via a programming modality analogous to Set Features commands. Furthermore, while adding features to an existing standardized set of features does represent modification to the controller, such can be accomplished with minimal impact on manufacturers since vendor specific feature addresses are already allocated. In this regard, no or minimal re-tooling or expensive procedure is required to allow for at least a subset of functionality tailored to two-terminal memory implementations to be provided for existing electronic devices. In some embodiments, feature functionality need only be programmed, for example, via firmware updates. In at least one embodiment, feature functionality can be achieved with no additional programming, for example, where emulation is managed by an on-chip controller that communicates off-chip according to existing programming. In some embodiments, this additional functionality available through post-fabrication programming modality(ies) can be compatible with NAND flash memory as well.

For instance, existing low-level commands for NAND flash memory provide for reading, programming (e.g., writing), and erasing data, such as those standardized by ONFI. Since NAND flash memory program commands typically require a previous erase command, NAND flash memory cannot perform a direct rewrite or overwrite at a given memory location. In contrast, the disclosed two-terminal memory allows changing the state of a given memory location irrespective of a current state of that memory location. Said differently, the numeric value (e.g., "0" or "1") assigned to a given memory location in a particular state can be modified independently of the current state. Such is referred to herein as "rewriting" or "overwriting" and is generally not available with NAND flash memory since a low-level program operation for NAND flash memory involves the current state being in the erased state. A vendor specific feature address can be assigned to executing a function described as rewriting or overwriting. An associated programming modality command can activate, or set as a default, the rewrite functionality that might only be suitable for non-NAND flash memory (e.g., the disclosed two-terminal memory). However, in some embodiments the same or another programming modality command might provide the ability to toggle off the rewrite functionality and revert to NAND-based program/erase commands. Therefore, a suitably programmed controller (e.g., configured to operate in a two-terminal memory paradigm) can leverage advantages provided by disclosed two-terminal memory systems, without excluding compatibility with NAND flash controllers. In still other embodiments, the same or another programming modality command could provide the ability to emulate high-level NAND operations (e.g., read, write, erase, etc.) with low-level two-terminal memory functionality (e.g., direct write or overwrite, configurable page size, associated memory cell addressing, associated error correction algorithms, and so on), thereby providing further advantages of two-terminal memory to a legacy NAND controlled system or device. Numerous other example functions that can be accessed via two-terminal memory post-fabrication program modalities (e.g., analogous to vendor specific feature addresses accessible via Set Features commands in the NAND paradigm), are detailed herein.

In this regard, this disclosure relates to functions accessed via a mechanism analogous to ONFI standards Set Features Commands that are specified to change operating characteristics of associated NAND flash memory and/or NAND flash memory devices. In some embodiments, instead of NAND flash memory elements, two-terminal memory cells are employed for digital information storage, and are configurable post-fabrication via a set of program modalities associated with respective sets of operating characteristics, logic configurations, interface translation schemes, or the like, or suitable combinations thereof, and accessed via respective ones of a set of program modality commands. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a conductive layer such as TiN or a conductive silicon (Si) bearing layer (e.g., polysilicon, polycrystalline, SiGe, etc.), a resistive switching layer (RSL) having defect regions and an active metal layer for providing filament forming particles to the defect regions of RSL. The p-type or n-type Si bearing layer can include a p-type or n-type polysilicon, p-type or n-type polycrystalline SiGe, or the like. The RSL (which can also be referred to in the art as a resistive switching media (RSM)) can comprise, e.g., an undoped amorphous Si layer, a semiconductor layer having intrinsic characteristics, a Si sub-oxide, and so forth. In various embodiments, the RSM includes a number of crystalline defects or defect regions. Examples of the active metal layer can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. In various embodiments, particles of the active metal layer become trapped within the defect regions of the RSM. These trapped particles are neutral metal particles that form conductive filaments within the RSM. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

The subject disclosure provides for two-terminal memory devices configured to operate according to a set of post-fabrication program modalities (e.g., such Get Features or Set Features functionality, or analogues thereof). In some aspects, the two-terminal memory can comprise 20 nanometer (nm) technology, whereas in other aspects the two-terminal memory can comprise sub-20 nanometer (nm) technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on.

In additional embodiments disclosed herein, there is provided a digital storage device comprising two-terminal memory. In some embodiments, such a digital storage device can be removably connected to a computing device (e.g., a host device). In other embodiments, the digital storage device can be integrated with the computing device (e.g., read only memory, random access memory, etc.). In particular embodiments, the digital storage device can be a memory stick that can be connected to a host computer over a memory interface (e.g., a host interface such as a universal serial bus (USB), or other suitable interface) and can store and retrieve information, and erase stored information, in response to commands by the host device.

The inventor(s) further believe that once two-terminal memory has been demonstrated as a viable alternative to NAND flash memory in the context of NAND flash memory devices, such will justify redesign of the controller element or other memory device elements to take full advantage of two-terminal memory with or without compatibility with NAND flash memory elements, devices, or standards.

Example Memory Devices

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, an example NAND flash memory device 100 is depicted. NAND flash memory device 100 can be a removable storage device, which can be connected to or disconnected from a host computing device (e.g., a computer, a laptop, a terminal, a smart phone, a table computer, etc.) by way of a communication interface (e.g., a universal serial bus (USB) interface, or another memory bus or interface). In some embodiments, NAND flash memory device 100 can be deployed on a hardware card for connecting with a server device or other computing device. In still other embodiments, NAND flash memory device 100 can be a stand-alone device configured to communicate with a remote host device via a suitable remote communication platform (e.g., a wireless interface, a cellular interface, a satellite interface, a wired interface, an Ethernet interface, a broadband over power line interface, or the like, or a suitable combination thereof).

NAND flash memory device 100 can comprise a controller 102. Controller 102 can operate according to defined standards such as ONFI standards. Controller 102 can be configured to communicate with a host computing device over a host interface 110. Host interface 110 can operate to receive (e.g., high-level) host commands from the host computing device related to memory modules 104 on memory device 100. Suitable host commands can include a write command, a read command, an erase command, an overwrite command, or the like, or suitable combinations thereof. Additionally, host interface 110 can be configured to receive data from the host computing device related to a host command, or provide data stored on one or more memory modules 104 to the host device in response to a host command.

In various embodiments, memory controller 102 can further comprise a memory interface 106 configured to communicate with and execute memory operations in conjunction with memory modules 104 over one or more memory channels/data busses 108 (referred to hereinafter as memory channels 108). Memory channels 108 can be 8-bit channels, 16-bit channels, or another suitable configuration. In some embodiments, memory controller 102 can perform low-level memory operations with memory modules 104, including write, erase, read, etc. in accord with the high-level host commands. In at least one embodiment, memory channels 108 can be NAND flash interfaces, conforming to a NAND flash standard or a non-standard NAND flash interface protocol (e.g., a custom or vendor-specific set of NAND flash protocols), or the like.

Memory controller 102 can further comprise a central processing unit (CPU) 112, an error correcting code (ECC) component 114, a block management (BM) component 116, Features component 118, as well as other suitable circuitry, modules, or components. CPU 112 can be configured to execute instructions associated with memory device 100. ECC component 114 can correct errors in data received from memory modules 104 based on various ECC algorithms such as, e.g., a Hamming code, a Bose-Chaudhuri (BCH) code, a Reed-Solomon (RS) code, a low density parity check (LDPC) code, or the like. Block Management component 116 can include circuitry and logic for bad block detection and wear leveling. Bad blocks (e.g., hardware failure) can be detected during low-level operations (e.g., program or erase), at power-on, or during suitable maintenance operations. Bad block and/or wear data can be stored to allocated locations of memory modules 104 or to RAM 120 (e.g., dynamic RAM, or other suitable RAM), which can provide for temporary storage, high speed operating memory, or other purposes that would be evident to one of ordinary skill in the art, which are considered within the scope of the subject disclosure.

In addition, NAND flash memory device 100 can comprise Features component 118 that can facilitate identifying or setting various operational characteristics (e.g., program modalities) associated with memory modules 104. ONFI standards detail functions denoted as Get Features and Set Features. Get Features functions can identify current or historic settings associated with memory modules 104. Set Features functions can set operational characteristics such as timing, drive strength, etc., as well as activate certain vendor specific functions. If controller 102 is compliant with ONFI standards, then Features component 118 can include circuitry and logic associated with the ONFI Get/Set Features functions. Otherwise, Features component 118 can include circuitry and logic relating to similar functions associated with identifying or setting operational characteristics of memory modules 104 provided by another suitable post-fabrication program modality (e.g., a standard program modality, a non-standard program modality, a custom program modality, etc.).

In one or more embodiments, memory modules 104 can be two-terminal memory devices, such as resistive-switching memory, phase-change memory, and so on. In some embodiments, host commands from the host computing device can comprise NAND-compliant high-level operating commands (e.g., block erase, page write, etc.). In one embodiment(s), controller 102 can convert the high-level NAND-compliant operating commands to NAND-compliant low-level operating commands. According to this embodiment(s), on-board logic or circuitry of memory modules 104 (not depicted, but see FIG. 3, infra) can be configured to convert the NAND-complaint low-level operating command to one or more two-terminal memory functions. In another embodiment, controller 102 can be at least in part configured to convert a high-level NAND-compliant operating command to a non NAND-compliant low-level operating command. In the latter embodiment(s), on-board logic or circuitry of memory modules 104 can be configured to convert the non-NAND-complaint low-level operating command to the two-terminal memory function(s).

Turning now to FIG. 2, example feature parameter definitions 200 are provided that relate to NAND flash memory devices. Get Features functions and Set Features functions, including vendor specific functions, can be accessed via defined Feature address locations. In this example, functions relating to a timing mode can be accessed via Feature address "01h". In other words, a Get Features command with the address of "01h" can identify a current or set of recent timing modes, whereas a Set Features command with the address of "01h" can operate to set a current timing mode. Various other Feature functions can be audited or set in a like manner, and while definitions 200 illustrate many examples, other examples might exist and are considered to be in the scope of this disclosure. Furthermore, one or more Feature addresses can be associated with a particular Feature function. For instance, although depicted as being associated with a single address (e.g., "01h"), timing mode could be associated with multiple addresses. It is underscored that many vendor specific functions can be accessed, in this example via Feature addresses "80h" through "FFh".

In some embodiments, controller 102 may be non-ONFI and NAND flash memory 104 elements may be non-NAND elements. In those embodiments, Features 118 can be interpreted according to a non-NAND scheme and can be suitable or optimized for the particular type of controller 102 and/or memory 104.

Figure 3:
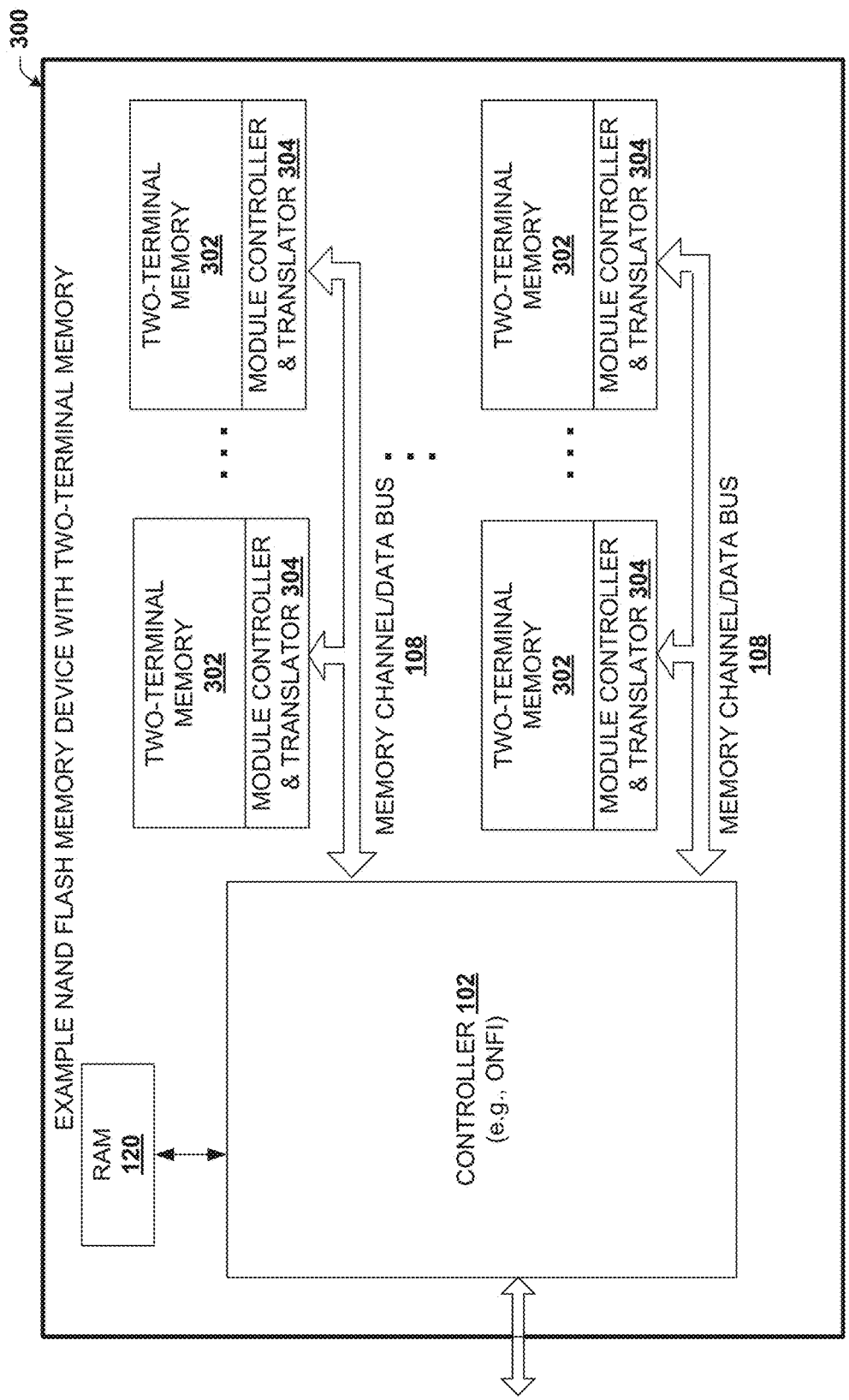
FIG. 3 illustrates a block diagram of an example NAND flash memory device with two-terminal memory in accordance with certain embodiments of this disclosure.

With reference now to FIG. 3, example device 300 is depicted. Device 300 provides an example NAND flash memory device with two-terminal memory. Hence, device 300 can be substantially similar to device 100 of FIG. 1 in that controller 102 and various other elements can be similar or identical, but rather than including NAND flash memory modules 104, device 300 comprises two-terminal memory 302. Since controller 102 is configured to control NAND flash memory (e.g., NAND flash memory modules 104) and in at least some disclosed embodiments can be compliant with ONFI or other NAND flash memory standards, one or more module controller and translator (MCT) 304 can be included. MCT 304 can be configured to provide low-level control of memory modules 302 and translate low-level NAND-based commands to low-level commands compatible with two-terminal memory arrays such as two-terminal memory modules 302. In some embodiments, a single MCT 304 can service multiple memory modules 302. In some embodiments, a separate instance of MCT 304 can be associated with one memory module 302, and in still other embodiments one MCT 304 can be provided for each module 302. In the latter case, MCT 304 can be integrated into memory module 302 as depicted, or can be coupled to memory module 302.

Two-terminal memory modules 302 can comprise an array(s) of memory cells for storing digital information, control hardware for accessing and writing the information, buffering memory (e.g., RAM, or the like) to facilitate control hardware processes and memory translation operations, cache, or the like, or a suitable combination thereof. In some embodiments, the array(s) of memory cells can comprise a crossbar arrangement of two-terminal memory cells. In the crossbar arrangement, intersecting wordlines and bitlines of the memory arrays can be configured to facilitate applying an electrical signal to one or more of the two-terminal memory cells of a memory module 302. Examples of such two-terminal memory cell technology can include, but are not limited to, resistive memory cells such as resistive-switching memory, resistive random access memory, or the like, or a suitable combination thereof. Examples of the disclosed two-terminal memory cell technology can be found at FIGS. 4A and 4B. An example of a crossbar arrangement of an array of two-terminal memory cells can be found at FIG. 5.

Figure 4A:
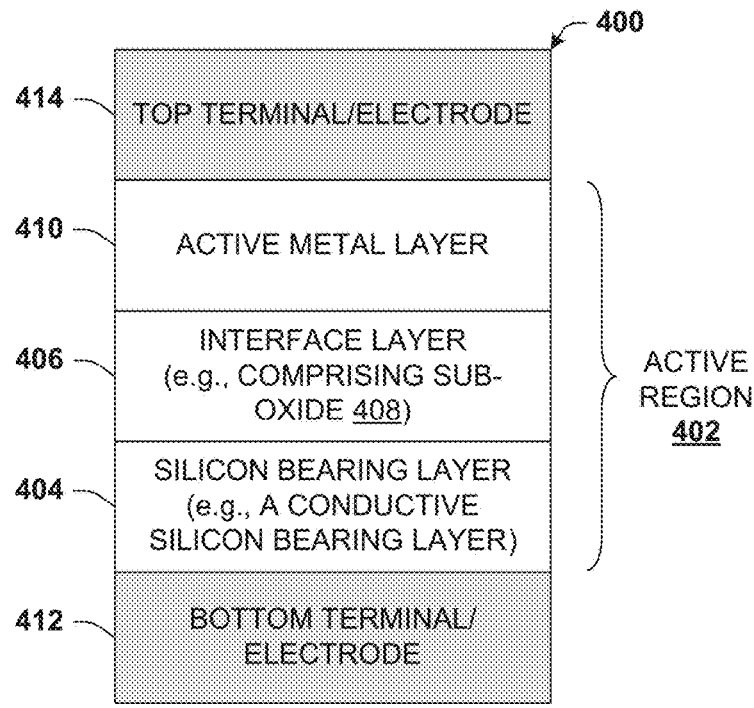
FIG. 4A depicts an example two-terminal memory cell in accordance with certain embodiments of this disclosure.
Figure 4B:
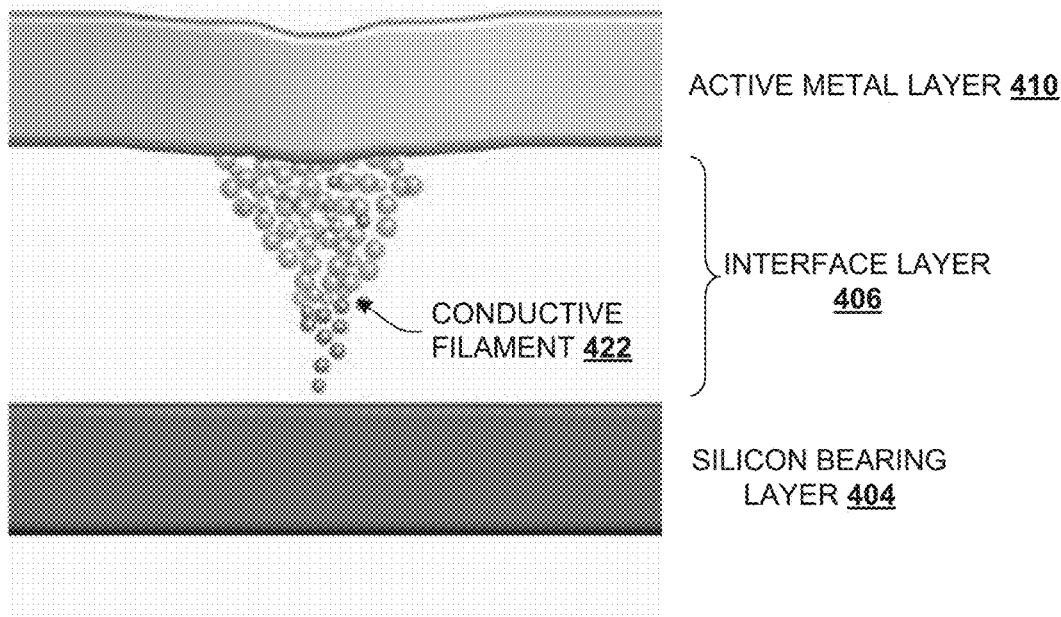
FIG. 4B depicts an example illustration that provides a cross-section of an example active region of an example two-terminal memory cell in accordance with certain embodiments of this disclosure.
Figure 5:
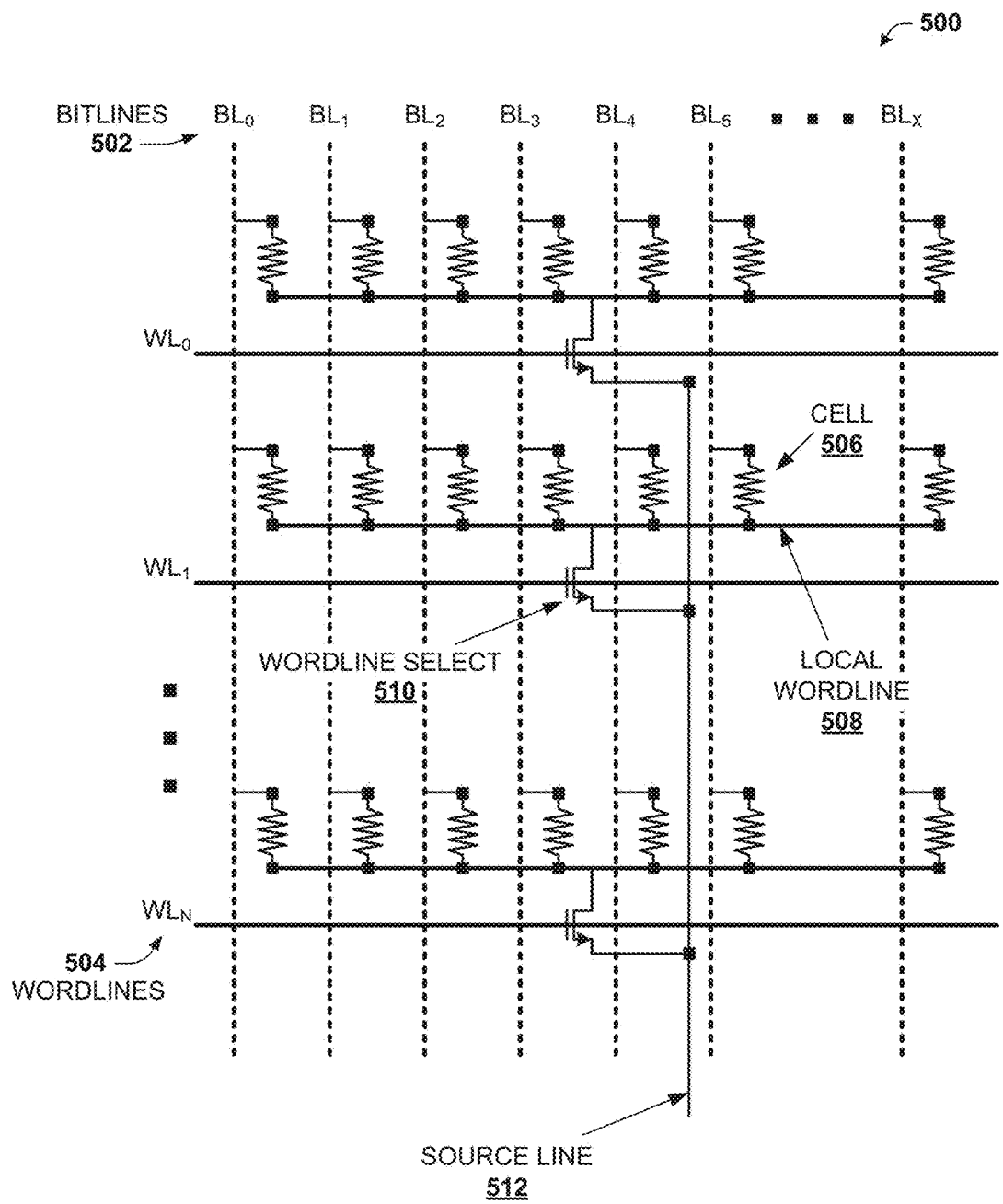
FIG. 5 illustrates a schematic diagram of an example memory architecture in accordance with certain embodiments of this disclosure.

While still referring to FIG. 3, but turning also to FIGS. 4A through 5, various examples of two-terminal memory technologies or arrangements are provided. FIG. 4A illustrates an example two-terminal memory cell 400. Cell 400 can be a resistive-switching memory device such as a resistive random access memory (RRAM) device, for which certain illustrative characteristics or aspects are provided with reference to FIG. 4B. Cell 400 may be a monolithic stack of layers and may be formed on top of an insulating substrate upon which one or more CMOS devices have been formed. In some embodiments, the CMOS devices include control transistors/control logic, or other devices (e.g. processor, logic) that may be selectively coupled to terminals of the two-terminal memory device.

The monolithic stack of layers of two-terminal memory cell 400 can include an active region 402 that can be situated between a bottom terminal 412 (e.g., one layer of the monolithic stack) and top terminal 414 (e.g., another layer of the monolithic stack). Active region 402 can be created comprising a contact layer (e.g. a metal layer, a silicon bearing layer, etc.) 404, interface layer 406, and active metal layer 410. Interface layer 406 can be composed of or comprise one or more engineered or controlled oxide(s), which is referred to herein as sub-oxide 408. Interface layer 406 can comprise a non-stoichimetric sub-oxide (e.g., sub-oxide 408) that can be a combination or mixture, possibly non-homogenous, of various silicon-based layers or elements with an aggregate chemical formula of $SiO_x$, where $0<X<2$. As another example, the aggregate chemical formula can be $Si_xGe_yO_z$, where $x≥0$, $y≥0$, $z≥0$, $x+y≤z≤2(x+y)$. In various embodiments, interface layer 406 includes multiple crystalline defects. Other examples can exist.

FIG. 4B depicts illustration 420. Illustration 420 provides a cross-section of an example active region 402 of an example two-terminal memory cell 400. In order to provide additional detail or context, it is understood that this disclosure relates to two-terminal memory cells, particularly resistive switching two-terminal memory cells, in various embodiments. Resistive switching two-terminal memory cells (also referred to as resistive switching memory cells or devices), as utilized herein, comprise circuit components having two electrical contacts (also referred to herein as electrodes or terminals) with an active region (e.g., active region 402) between the two conductive contacts (e.g., terminals 412, 414).

An example of the active region 402 of the two-terminal memory cell 400 is provided by illustration 420. This active region 402 can exhibit a plurality of stable or semi-stable resistive states, each resistive state having different electrical characteristics (e.g., resistance). Moreover, respective states of the plurality of states can be formed or activated in response to a respective voltage difference applied at the two conductive contacts. One example of a resistive switching two-terminal memory device, though not exhaustive, can include a resistive random access memory (RRAM) cell or device.

Embodiments of the subject disclosure can provide a filamentary-based memory cell. For example, in a 'programmed' or 'on' state, in response to a program voltage applied across the terminals 412, 414, ions are injected from active metal layer 410 and permeate interface layer 406 upon application of a program or write voltage, for example, which is further detailed infra. Once the program voltage is removed, the ions are trapped within the defects of interface layer 406 and become neutral metal particles. In some embodiments, the trapped metal particles form one or more conductive filament 422. One example of a filamentary-based memory cell can comprise: a conductive layer (e.g., p-type (positive) silicon bearing layer 404 TiN, or the like); the interface layer 406 (also referred to as a resistive switching layer or a resistive switching material layer), which in this case can comprise sub-oxide 408 (or other material having crystalline defects, e.g., undoped amorphous silicon), and active metal layer 410 for providing filament forming particles into the interface layer 406. The contact layer 404, e.g., p-type (or possibly n-type) silicon bearing layer 404 can include a p-type polysilicon, p-type SiGe, or the like. In other embodiments, contact layer 404 may be TiN, TaN, or other metal, conductive polysilicon, conductive polycrystalline SiGe, and so on. In some embodiments, one or more electrodes 412, 414 and conductive layer 404 may be the same material, or multiple layers. The interface layer 406 can comprise, e.g., an undoped amorphous silicon layer or mixture, a doped polysilicon layer or mixture, a doped silicon germanium layer or mixture, a semiconductor layer or mixture having intrinsic characteristics, a silicon sub-oxide layer or mixture, and so forth.

Examples of the active metal layer 410 can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing can be employed for the active metal layer 410 in some aspects. In some embodiments, an active metal layer 410 may comprise two or more layers of materials (e.g., sub-layers), such as a layer of silver, aluminum, or the like above a thin layer of oxidizable metal, e.g. titanium. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

Generally, to program one or more memory cells, a suitable program voltage can be applied across the memory cell(s) causing a conductive filament(s) or path(s) to form through a resistive portion (e.g., interface layer) of the memory cell as mentioned above. This can further cause the memory cell to switch from a relatively high resistive state, to a relatively low resistive state. An erase process can be implemented to reverse or disassociate the conductive filament(s), at least in part, causing the memory cell to return to the high resistive state from the low resistive state. This physical change of state, in the context of memory, can be associated with respective logical states of a binary bit (or of multiple bits, in the case of the conductive filament(s) being programmable to four or more distinct resistance states). Accordingly, multiple such memory cells can be programmed or erased to represent respective zeroes or ones of binary information and, by retaining those states over time, in effect persist binary information. For various reasons, in some embodiments, resistive switching memory cells are generally quick to program and responsive, changing state readily in response to a program voltage or an erase voltage. This quick switching of state is a significant advantage of various disclosed memory cells over other memory cell technologies.

As applied to illustration 420, when a suitable program voltage (e.g., a positive voltage) is applied across the terminals of two-terminal memory cell 400, ions from active metal layer 410 form and move into the adjacent interface layer 406, which is at least partially permeable to the ions that collectively form one or more conductive filament(s) 422, which although depicted as a single filament can be multiple filaments. Conductive filament 422 can span the entire thickness or a portion of the interface layer 406, facilitating increased electrical conductivity through the interface layer 406, which otherwise has a high electrical resistance. In some cases, when the program voltage is removed, the ions from the active metal layer become trapped within defect regions of interface layer 406 and become neutral metal particles.

When the conductive filament 422 forms, the memory cell is said to be in the on-state, which is a low-resistance state. For a bipolar device, in response to a suitable erase voltage (e.g., a negative voltage), conductive filament 422 can at least in part deform or retract, breaking the electrical conductive path. In some embodiments, the particles trapped within interface layer 406 move back toward active metal layer 410, thereby shortening conductive filament 422. Such is a high-resistance state, associated with an off-state. Other suitable de-programming/erase mechanisms consistent with unipolar device operation can exist for causing the off-state for a unipolar two-terminal memory. The state can be determined by measuring current through cell 400 when a suitable read voltage is applied. The read voltage generally is not sufficient (or the proper polarity) to either form or disperse conductive filament 422 (e.g., significantly disrupt the neutral metal particles trapped within the defect locations), so current readings associated with the read current can be used to determine if the cell is in the high-resistance state (e.g., off) or the low-resistance state (e.g., on). In this example, two-terminal memory cell 400 is in the on state, with conductive filament spanning a significant portion of interface layer 406, in other embodiments, the reverse convention may also be used.

FIG. 5 illustrates a schematic diagram of an example memory architecture 500 according to one or more aspects of the subject disclosure. Memory architecture 500 can be a subset of a memory array incorporated as part of a non-volatile, solid state memory storage device in some disclosed aspects (e.g., two-terminal memory 302). For example, memory architecture 500 can be a sub-block of a block of memory, where the sub-block comprises global wordlines of the block of memory, and a subset of bitlines of the block of memory that share a set of common local wordlines that are exclusive to the sub-block of the block of memory. Although memory architecture 500 is depicted with local wordlines 508 connected to respective sets of seven memory cells 506, a different number of memory cells 506 per local wordline can exist for various embodiments.

Memory architecture 500 can comprise a set of bitlines 502. Set of bitlines 502 comprises individual bitlines $BL_0$, $BL_1$, $BL_2$, . . . , $BL_X$, where X is a positive integer greater than one. Intersecting set of bitlines 502 is a set of wordlines 504. Set of wordlines 504 comprises individual wordlines $WL_0$, $WL_1$, . . . , $WL_N$, where N is a positive integer greater than one. In one embodiment, X can be an integer equal to 8 and N can be an integer equal to 512; however, the subject disclosure is not so limited and X and N can have other suitable values. For instance, X or N can be larger numbers where memory cells 506 comprise non-linear current-voltage characteristics (e.g., provided by a volatile selector device associated with respective memory cells 506 as described in co-pending U.S. patent application Ser. No. 13/960,735, entitled SWITCHING DEVICE HAVING A NON-LINEAR ELEMENT and filed Aug. 6, 2013, incorporated by reference herein in its entirety and for all purposes, or by another suitable mechanism for providing a non-linear current-voltage response for two-terminal memory).

As mentioned above, set of bitlines 502 can be associated with a sub-block of a block of memory, such that set of bitlines 502 share a set of local wordlines 508 that are exclusive to the sub-block of the block of memory. Respective ones of the set of local wordlines 508 are connected to a group of memory cells 506. Memory cells 506 have a first terminal connected to one of set of bitlines 502, and a second terminal connected to one of set of local wordlines 508. Local wordlines 508 are connected to a source line 512 by respective wordline select transistors 510. Each wordline select transistor 510 is positioned to electrically connect (when activated, or in a conducting state) or electrically disconnect (when deactivated, or in a resistive state) respective ones of the local wordlines 508 with/from source line 512. Respective wordline select transistors 510 can be gated transistors (e.g., single gate, floating gate, and so on) in some embodiments. Respective gates of wordline select transistors 510 are connected to and controlled by respective ones of set of wordlines 504, as depicted.

Application of a suitable electrical signal to a selected one of bitlines 502 and a selected one of local wordlines 508 can facilitate performing memory operations on a target one(s) of memory cells 506. Applying the electrical signal to the selected one of local wordlines 508 can be implemented by source line 512 and an associated one of set of wordlines 504 (e.g., see FIG. 2, infra). Memory cell operations that can be implemented utilizing the circuitry of memory architecture 500 can comprise activating, deactivating, programming, erasing, overwriting (e.g., rewriting), etc., the target memory cell(s) 506, by applying a suitable electric signal to one of bitlines 502 and one of local wordlines 508 connected to the target memory cell(s) 506 (see, e.g., FIG. 6, infra).

Still referring to FIG. 3, by utilizing a crossbar architecture of two-terminal memory cells, the inventor(s) of the subject application believe memory device 300 can provide greater flexibility in performing memory operations over NAND flash memory. For example, where the crossbar architecture facilitates individual MCT 304 addressing for individual memory cells, memory modules 302 can be operated to directly overwrite selected memory cells of respective arrays of memory cells. The inventor(s) believe that memory device 300 can mitigate or avoid what are, in the inventor(s) opinion, drawbacks of NAND flash memory, even for a memory device configured to operate according to NAND flash standards. Such drawbacks include, for instance, the inability of NAND flash memory to directly overwrite a memory cell without first erasing a block of memory in which the memory cell resides. Coupled with the fact that NAND flash programs or writes on the page level (e.g., one page of memory), but erases only on the block level, NAND flash is often associated with higher write amplification values (e.g., about 3 on average) than can be achieved with two-terminal memory. Since two-terminal memory can support changing the state of a memory cell(s) independently of the current state of the cell, two-terminal memory can support overwrite functions and therefore achieve an optimal non-compressed write amplification value of one. In addition to the foregoing, because two-terminal memory can support operations on a smaller number of memory cells than NAND flash (e.g., operations affecting one or more words, one or more bytes, even one or more bits, depending on two-terminal memory architecture), two-terminal memory can perform operations analogous to NAND operations at lower power, with higher performance, while maintaining greater memory cell longevity, by virtue of inherent two-terminal memory longevity characteristics, and by avoiding wasteful page write or block erase operations. The abovementioned drawbacks also lead to higher device overhead for garbage collection functions for NAND flash memory. In contrast, two-terminal memory, which is not required to follow the page-program, block-erase paradigm of NAND flash memory and further is not limited in the number of times a page can be programmed without being erased, can potentially dispense with garbage collection overhead. Another drawback is that NAND flash memory is a relatively "dirty" memory in which bit errors are relatively common and thus requires comprehensive ECC and bad block management and so on, which accounts for overhead that can be reduced with two-terminal memory arrangements. Accordingly, memory device 300 with two-terminal memory modules 302 can have significant advantages in operational efficiency, memory retention, memory endurance, read and write speeds, power consumption as well as other characteristics.

In alternative or additional embodiments of the subject disclosure, an array(s) of memory within one or more of memory modules 302 can respectively comprise multiple blocks of memory, wherein at least one of the respective blocks of memory comprise multiple sub-blocks of memory. A sub-block of memory (e.g., FIG. 5) is associated with one subset of the bitlines of an associated one of the blocks of memory. The number of the bitline subsets can vary according to different embodiments, as can the number of bitlines in a given subset of the bitlines. Each sub-block and associated subset of the bitlines has an associated set of local wordlines that can be exclusive to the sub-block. Each sub-block also comprises a number of groups of two-terminal memory cells equal to a number of wordlines of the memory modules 302. A single group of memory cells within a sub-block comprises two-terminal memory cells that are connected at one respective end thereof to one local wordline of the sub-block of memory. In addition, the memory cells of each group within a sub-block are connected at another respective end thereof to one bitline of the bitline subset of that sub-block.

The controller portion of MCT 304 can be configured to control operational characteristics of two-terminal memory modules 302. MCT 304 can also include a translator portion that can include translator logic and be configured to translate low-level memory commands configured for NAND flash memory arrays (e.g., standardized low-level NAND command, non-standard low-level NAND command, etc.) to low-level commands compatible with two-terminal memory arrays such as two-terminal memory modules 302. Such translation can relate to low-level command sets for reading, programming, and erasing as well as an active program modality (e.g., Set Features) commands. Whether accessing or modifying memory or activating post-fabrication program modality functions, a conventional NAND flash controller (e.g., controller 102) is programmed or configured to be interacting with NAND flash memory, and thus expects NAND-compliant operations, logic, acknowledgments, and the like. According to one or more disclosed embodiments, translators 304 can be configured to operate in a seamless manner such that controller 102 need not be substantially reconfigured or modified in order to control two-terminal memory modules 302. Further, the translator portions of MCT 304 can be activated or deactivated based on the current implementation. For example, translation can be deactivated in cases where controller 102 is configured for NAND flash memory-based protocols, yet activated otherwise.

With respect to read, program, and erase instructions, such instructions can be emulated by MCT 304. For example, typical NAND flash memory read or program commands operate to read or program a page of memory. Since low-level two-terminal memory commands can also read and program a page at a time (or even smaller sizes such as double words, words, bytes, nibbles, or even a single bit), such commands can be readily emulated. Typical NAND flash memory erase commands operate to erase a block of memory per command. MCT 304 can emulate a NAND flash memory block erase command by, e.g., transmitting a series of page erase commands to two-terminal memory, which can be tallied with a simple counter, for example.

Moreover, since two-terminal memory supports rewrite/overwrite operations, in some embodiments, a rewrite operation can emulate either one or both of the NAND flash memory program command or erase command. Put another way, since rewrite operations of two-terminal memory are not dependent on a current state of a particular memory cell, the rewrite command can function as both a program command and an erase command typical of NAND flash memory command sets.

With respect to Features functions such as those associated with NAND flash memory controller Get Features and Set Features functions, MCT 304 can translate such commands as well. For example, consider a Set Features command relating to timing. Since the disclosed two-terminal memory can serve data operations faster than existing NAND flash memory, timing expected by NAND-based controllers can be emulated by appropriately delaying the service of data operations in some embodiments. For example, a typical timing setting for a NAND flash memory might expect a memory read operation to be performed in 25 µs. In contrast, two-terminal memory might be capable of performing the same or similar read operation (e.g., a page of data) in 1 µs or less. The retrieved data can wait (e.g., up to about 24 µs) in a register until controller 102 is ready to receive, or the data can be retrieved and input to the register after an appropriate delay. It is noted that embodiments that emulate by delaying to match NAND flash memory expectations might not achieve significant speed advantages, but can still provide other advantages such as lower power consumption, low fabrication cost, improved memory density, better memory endurance, lower ECC, block management and garbage collection overhead, while avoiding overhead associated with fabricating a new memory device 300, replacing controller 102, or reprogramming controller 102 to non-ONFI operations and communication protocols. In embodiments where data operations are not delayed, then significant speed advantages can be realized as well.

In some embodiments, MCT 304 can emulate the NAND data operation by performing multiple operations. Since two-terminal memory data operations tend to be significantly faster than corresponding NAND flash memory data operations, these multiple operations can be performed within the allocated timing. As one example, consider again the NAND flash memory read operation that is expected to be performed in 25 µs and is expected to read one page of data. For NAND flash memory, the size of a page of data is linked to physical characteristics of the NAND flash memory. Yet, host applications often make different presumptions about page size. For instance, mobile applications typically presume a page size of 512 bytes to two kilobytes whereas a page size for desktop applications can be much larger. MCT 304 can mitigate associated difficulties by providing a configurable page size that can be better suited to a larger set of host applications. In some embodiments, the configurable page size can be accomplished by selecting a relatively small page size. If the host application or controller 102 expects or is optimized by a larger page size, then multiple page reads can be performed to emulate a single, larger page size. Generally, these multiple page reads can be performed in the time expected for a single NAND flash memory page read. As another example, consider a NAND flash memory block erase operation. MCT 304 can emulate a block erase by performing many page erase (or rewrite) operations.

MCT 304 can emulate other NAND Set Features commands as well, for instance, by modifying various values designed for NAND flash memory to values that are compatible with two-terminal memory. For example, I/O drive strength, external Vpp configuration or other electrical characteristics can be set to values for operating two-terminal memory, while performing suitable conversions in conjunction with communicating with controller 102 (e.g., delay to match a NAND clock, etc.). Since NAND flash memory typically allows many different settings for a particular operating characteristic, in some embodiments, MCT 304 can set all such values to a single associated value optimized for two-terminal memory. In other embodiments, MCT 304 can map one or more NAND flash memory values to one or more two-terminal memory values.

As discussed, MCT 304 can translate a single NAND-based command to many two-terminal memory commands. In some embodiments, MCT 304 can translate many NAND-based commands to a single two-terminal memory command. For example, consider the case in which controller 102 is instructed (e.g., by the host) to update a particular page of memory that was already programmed. Since NAND cannot typically write to a single page more than once without risking a write disturb error, a typical solution is to copy block A (e.g., the block of data that includes the page to be written to) to block B (e.g., a clean block that was last erased) with the desired changes to the page. L2P routines keep track of the changes that block B is now logically referenced for data relating to physical block A. Thereafter, garbage collection routines will eventually mark block A as stale and erase the block so that it can be subsequently used without write disturb errors. This NAND process might involve many low-level commands issued to the memory. In those cases, MCT 304 can emulate all commands with a single page overwrite command (or a double word overwrite(s), word overwrite(s), bit overwrite(s), etc.), since two-terminal memory does not suffer from write disturb and is not required to first erase a block before writing to a page in that block. Moreover, subsequent L2P mapping and garbage collection can be avoided, where unnecessary. In some embodiments, various commands can be stored to a buffer included in or coupled to MCT 304.

Figure 6:
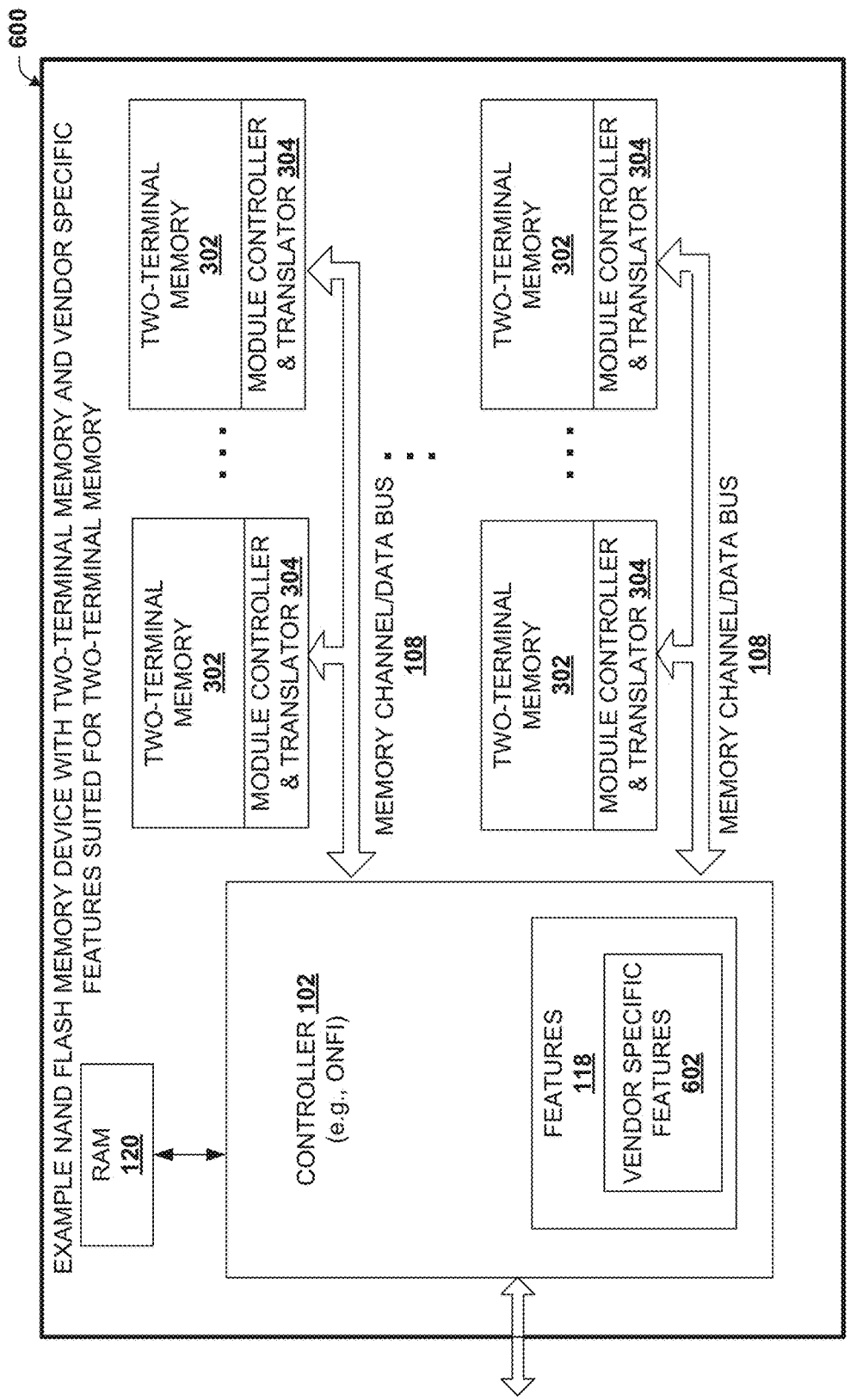
FIG. 6 illustrates a block diagram of an example NAND flash memory device with two-terminal memory and vendor specific Features suited for two-terminal memory in accordance with certain embodiments of this disclosure.

Turning now to FIG. 6, device 600 is depicted. Device 600 illustrates an example NAND flash memory device with two-terminal memory and vendor specific Features suited for two-terminal memory. Vendor specific features 602 can relate to programmable sets of operating characteristics to which two-terminal memory 302 can be programmed via associated post-fabrication programming modalities, similar to those utilized by standardized NAND flash memory devices (e.g., standard Get/Set Features, standard operating modes, etc.). Hence, vendor specific features 602 can provide for certain operating characteristics or sets of operating characteristics desired by a particular manufacturer or vendor, or operating characteristics requested by a customer of the manufacturer or vendor. In the arrangement depicted by device 600, since modules 302 are two-terminal memory (rather than NAND flash memory), vendor specific features 602 can be leveraged to provide additional advantages or benefits. It is understood that vendor specific features 602 and/or Set Features commands detailed herein need not be ONFI specific, particularly in connection with embodiments that do not relate to ONFI standards or NAND-based controllers. In some embodiments, Get/Set Features and/or operating modes can be programmed with a post-fabrication testing device that sets the associated programming modalities.

In some embodiments, vendor specific features 602 can relate to the concept or properties of rewriting or overwriting. NAND flash requires different operations for setting a sensed value of a particular memory cell to "0" (e.g., a program operation) than for setting the value to "1" (e.g., an erase operation). Since two-terminal memory can set the sensed value of a particular memory cell independent of that cell's current state, a single operation (e.g., rewrite/overwrite) can function as both program and erase operations utilized by NAND flash memory. Thus, one of vendor specific features 602 can operate to specifically instruct MCT 304 or memory module 302 to perform data operations according to the rewrite paradigm instead of the program-erase paradigm associated with NAND flash memory. Such can be accomplished by an associated Set Features command (e.g., one that specifies the vendor specific address location regions). In some embodiments, the Set Features command can toggle on or off this overwrite capability or set the default to on or off. Accordingly, the Set Features command can maintain a degree of backward compatibility. Said differently, the Feature can be set to on or default to on in cases where two-terminal memory is present, but set to off or default to off in cases where controller 102 is coupled to NAND flash memory, for example.

In some embodiments, vendor specific features 602 can relate to the concept or properties of erasing a block of memory. The smallest region of memory that NAND flash memory is capable of erasing is a block. As previously noted, two terminal memory can erase (e.g., set memory to a particular state) for small regions of memory such as a page or the like. Thus, an associated Set Features command can set or set as default two-terminal compatible erase commands. For example, when set, controller 102 can issue multiple page erase commands to facilitate a conventional NAND flash memory block erase. It is appreciated that by implementing certain Set Features commands, certain translator elements associated with MCT 304 can be disabled or unnecessary. For instance, in the present example, MCT 304 need not translate a NAND flash memory block erase command (to many page erase commands) if controller 102 effectively performs a similar function due to a particular Set Features command.

In some embodiments, vendor specific features 602 can relate to the concept or properties of adjusting a page size. For example, device 600 can include one or more registers that temporarily store data being read from a memory module 302 and transmitted to controller 102 or received from controller 102 and written to memory module 302. MCT 304 can retrieve data from or populate these register(s) irrespective of a setting relating to page size. For instance, consider a typical NAND-based page size of two kilobytes. In that case, a given register will commonly be capable of storing approximately two kilobytes of data for read and write operations. However, since two-terminal memory can support configurable page sizes, improved compatibility can be achieved with host applications. In cases where the host is a mobile application that expects a page size of, e.g., 512 bytes, the page size can be set to 512 bytes. In cases where the host is a desktop application that expects a larger page size, the page size can be set to a larger value, typically up to the limits of the register(s). As one example, such can be accomplished via a Set Features command that sets the page size to a suitable or supported value. As with other examples detailed herein, such can include a backward compatibility option to be compatible with NAND flash memory or to turn the function off to revert back to normal NAND-based operation.

In some embodiments, vendor specific features 602 can relate to properties with garbage collection routines. As discussed herein, two-terminal memory supports overwrite functionality and is not subject to many of the limitations of NAND flash memory. For example, NAND flash memory writes/programs on the page level, but erases only on the block level. NAND flash memory also requires an erase prior to a write for a particular memory cell, and recommends that only a single write within a given page can be accomplished without a subsequent erase of the entire block to avoid write disturb errors. These and other features of NAND flash memory result in relatively extensive garbage collection that is typically handled by controller 102 or another controller. Since two-terminal memory is not subject to many of the causes that result in the need for garbage collection, such garbage collection can be avoided or reduced, which can reduce associated overhead. In this regard, a Set Features function can be provided to deactivate all or certain types of garbage collection that can be advantageously utilized by two-terminal memory arrangements.

In some embodiments, vendor specific features 602 can relate to concepts or properties associated with ECC routines. As discussed herein, typical NAND flash memory devices utilize a variety of ECC algorithms. One of the most commonly used ECC algorithms is Bose-Chaudhuri (BCH) code. Recently, more advanced algorithms, low density parity check (LDPC) have been introduced. Generally, LDPC is significantly more efficient than BCH or others, but the efficiency LDPC is linearly related to the number of errors in the data being checked by ECC. Since NAND flash memory typically has a relatively high BER, if the number of errors is too high, LDPC algorithms become less efficient than others or might not work at all. In contrast, two-terminal memory, with a significantly lower BER can improve the efficiency of LDPC algorithms (e.g., due to a lower BER) and further can be more certain that LDPC algorithms can be successfully utilized over the expected life of device 600. In this regard, ECC overhead can be reduced by, e.g., a Set Features function that selects the most efficient ECC algorithms in connection with two-terminal memory.

In some embodiments, vendor specific features 602 can relate to concepts or properties associated with block management procedures and/or a memory health indicator. As discussed herein, typical NAND flash memory devices utilize block management elements to store a history of bad blocks of memory so that those blocks with failures are not used in connection with memory operations. In NAND-based implementations, memory health indicators can be employed to predict when certain cells, pages, or blocks will fail, in which case these blocks can be marked as bad. Two-terminal memory generally has a significantly higher endurance, and therefore can reduce overhead relating to block management and health indicator analysis. Such overhead can relate to storage required for recording bad blocks, lost capacity of memory elements with bad blocks, processing to detect bad blocks, processing to predict bad blocks and so on. In cases where two-terminal memory does not utilize a prediction-based health monitor, failure can still be detected (and corrected) by ECC operations, and the failure marked by block management elements. In this regard, a Set Features function can be provided that selects block management and/or health indicator functions that are more advantageous in connection with two-terminal memory. As with other functions detailed herein, such can be backward compatible with NAND by turning the function off with, e.g., the same or a different Set Features function.

In some embodiments, vendor specific features 602 can relate to concepts or properties associated with pagination for MLC arrangements. Most NAND flash memory devices today are architected according to a multi-level cell arrangement, wherein a single memory cell can store more than one bit of information. Due to the capacitive coupling of the floating gate NAND flash memory architecture, MLC arrangements initially had many disturb issues. One solution for MLC arrangements was to logically define the multiple bits of a cell as belonging to different pages of memory. This virtual solution was successful in reducing disturb issues associated with MLC NAND flash memory, but required that two or more bits that are physically adjacent or in fact belonging to the same memory cell are logically separated by an entire page of memory. One consequence of this arrangement is that sensing operations are slower than otherwise necessary since page-based operations proceed sequentially and one bit is required to be on a different page than another and therefore at least one bit of a cell must take a longer time for the sensing operation. Since two-terminal memory does not share similar disturb issues, all bits in an MLC arrangement can be on the same page and even logically adjacent, which is more intuitive, will not increase timing for sensing operations in such an arrangement, and can reduce L2P overhead. In this regard, a Set Features function can be provided that can select between conventional pagination where MLC bits are logically on different pages that is compatible with NAND and two-terminal memory and pagination where MLC bits are on the same page which is not compatible with NAND but is compatible with two-terminal memory arrangements.

Example Methods for Setting Memory Operational Characteristics

The diagrams included herein are described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 7-10. While for purposes of simplicity of explanation, the methods of FIGS. 7-10 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 7:
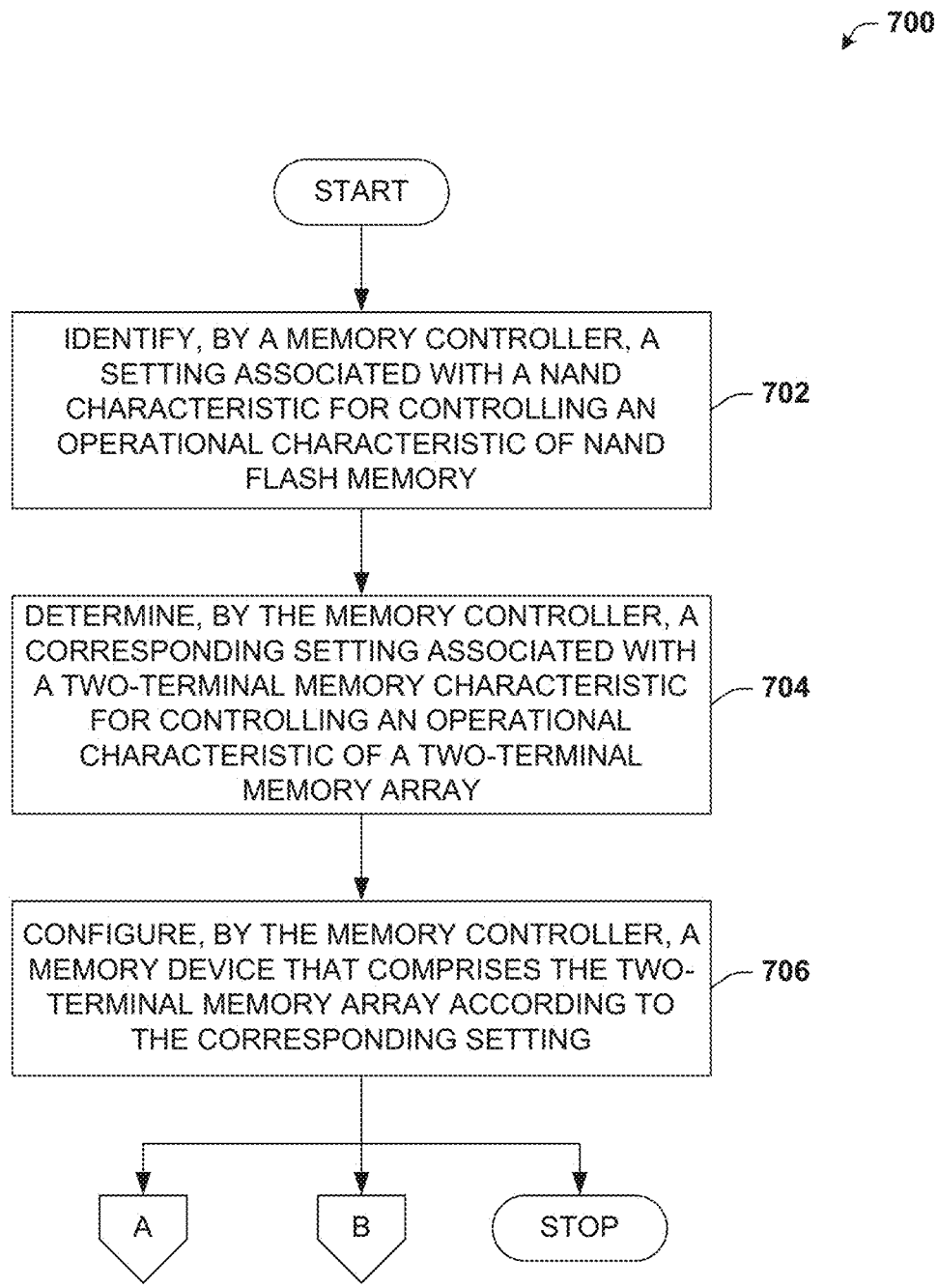
FIG. 7 illustrates an example methodology that can provide for setting operational characteristics for a NAND flash memory device that includes two-terminal memory elements in accordance with certain embodiments of this disclosure.

FIG. 7 illustrates exemplary method 700. Method 700 can provide for setting operational characteristics for a NAND flash memory device that includes two-terminal memory elements. For example, at reference numeral 702, a setting associated with a NAND characteristic for controlling an operational characteristic of NAND flash memory can be identified. The identification can be accomplished by a two-terminal memory-based controller (e.g., an MCT), which can be included in or coupled to (e.g., via a memory channel and/or data bus) a two-terminal memory module.

At reference numeral 704, a corresponding setting associated with a two-terminal memory characteristic for controlling an operational characteristic of a two-terminal memory array can be determined. In some embodiments, determination of the corresponding setting can be based on the setting detailed in connection with reference numeral 702. In some embodiments, certain NAND settings can be mapped to defined two-terminal memory corresponding settings.

At reference numeral 706, a memory device that comprises the two-terminal memory array can be configured according to the corresponding setting.

Figure 8:
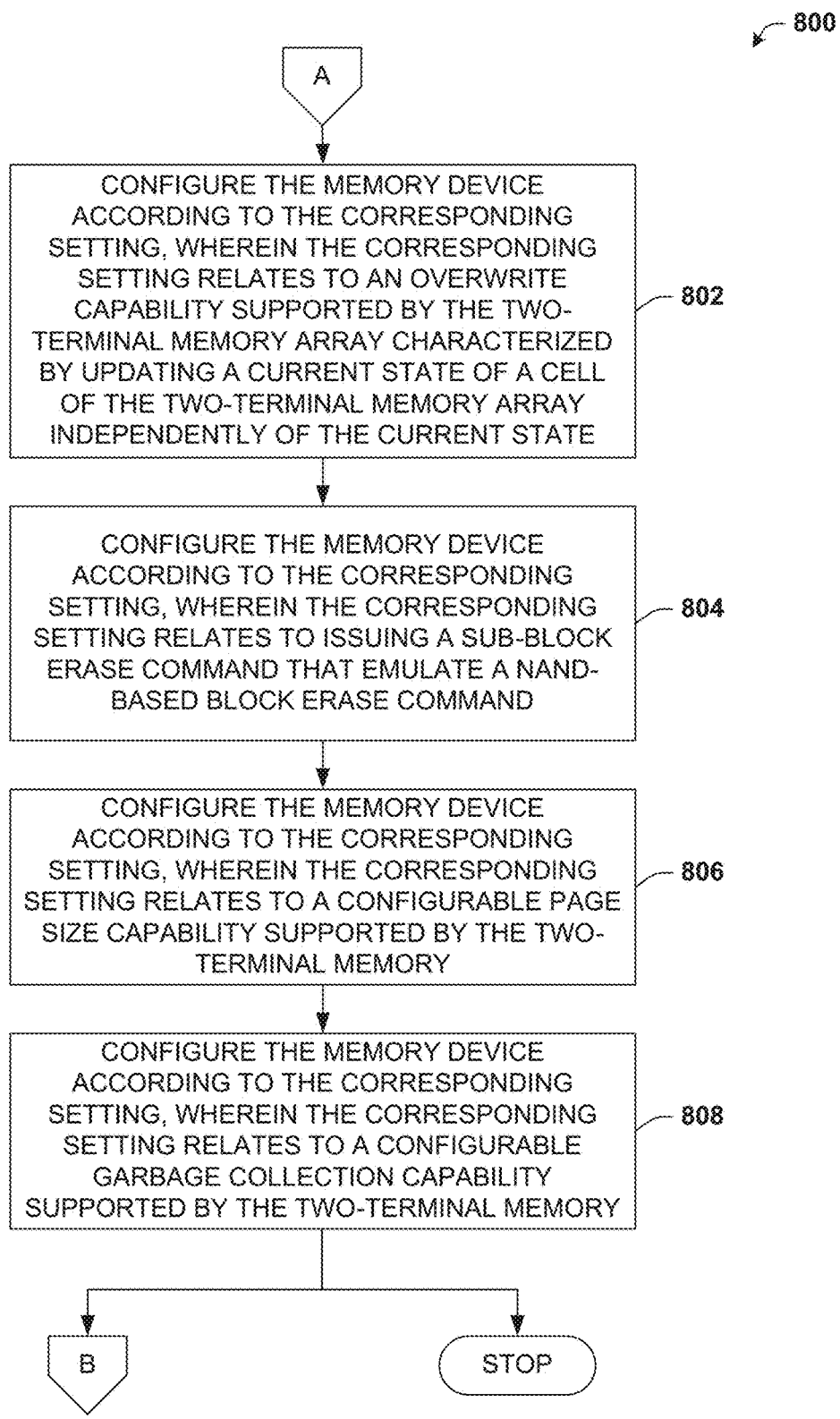
FIG. 8 illustrates an example methodology that can provide for additional aspects or elements in connection with setting operational characteristics for a NAND flash memory device that includes two-terminal memory elements in accordance with certain embodiments of this disclosure.

Referring now to FIG. 8, exemplary method 800 is illustrated. Method 800 can provide for additional aspects or elements in connection with setting operational characteristics for a NAND flash memory device that includes two-terminal memory elements. At reference numeral 802, the memory device detailed by method 700 of FIG. 7 can be configured according to the corresponding setting. The corresponding setting can relate to an overwrite capability supported by the two-terminal memory array. The overwrite capability can be characterized by updating a current state of a cell of the two-terminal memory array independently of the current state.

At reference numeral 804, the memory device can be configured according to the corresponding setting, wherein the corresponding setting relates to a sub-block erase capability characterized by issuing a sub-block erase (e.g., overwriting) command that emulate a NAND-based block erase command. Such emulation can be based on issuing several sub-block erase commands to operate on an entire (or some subset) of a block of memory or operate on relevant bits, bytes, words, etc. of the block of memory.

At reference numeral 806, the memory device can be configured according to the corresponding setting, wherein the corresponding setting relates to a configurable page size capability supported by the two-terminal memory. Changing the page size can, e.g., change the number of bits or bytes that are typically accessed when performing a read or write operation or the like.

At reference numeral 808, the memory device can be configured according to the corresponding setting, wherein the corresponding setting relates to a configurable garbage collection capability supported by the two-terminal memory. For instance, unlike NAND, since two-terminal memory does not require an erase operation to set memory cells to a particular state prior to a program operation and can does not require distinct bit sizes for program command (e.g., a page) versus an erase command (e.g., a block), garbage collection can be substantially mitigated. As one example, the corresponding setting can toggle garbage collection on/off.

Figure 9:
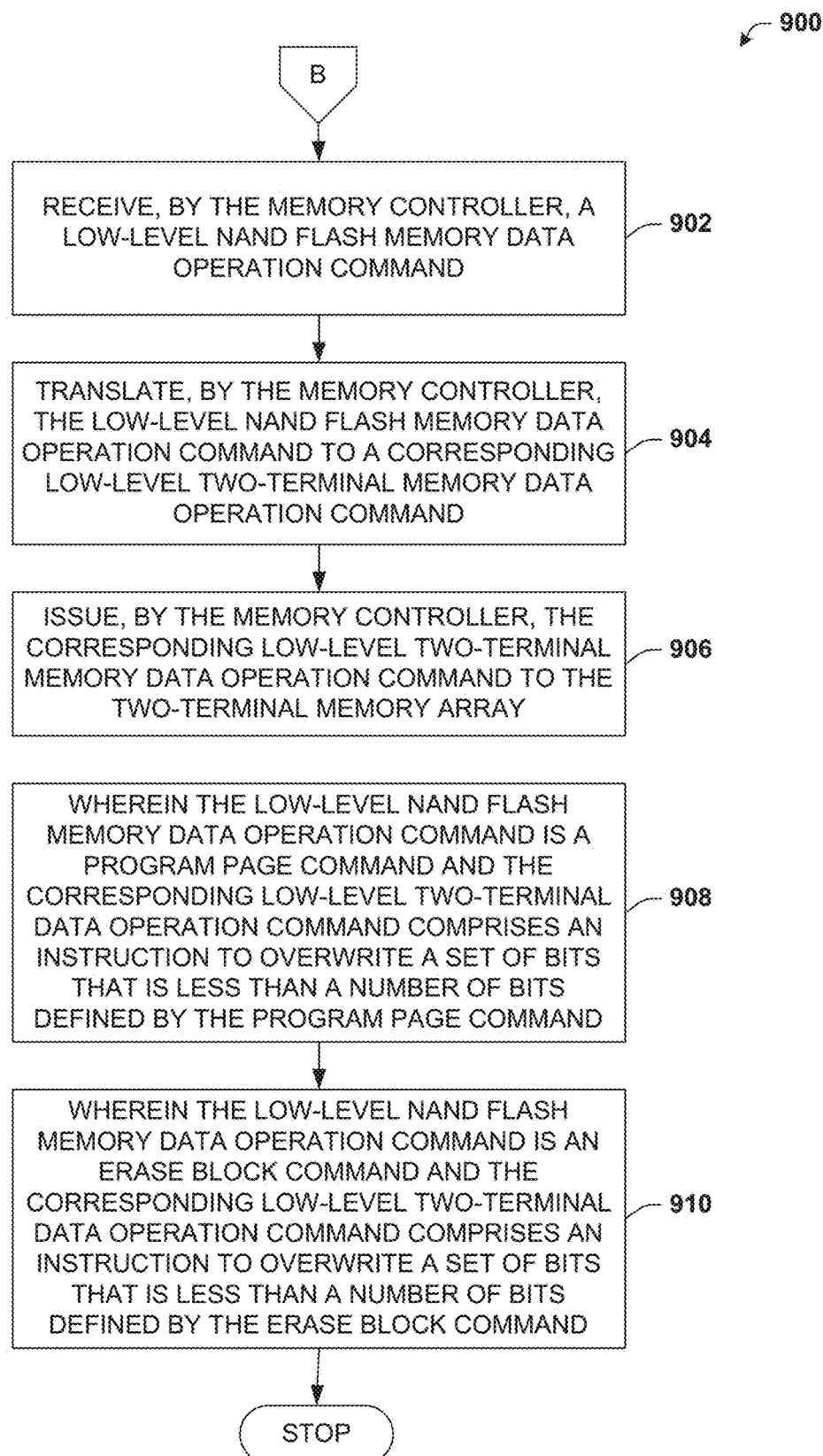
FIG. 9 illustrates an example methodology that can provide for additional aspects or elements in connection with setting data command characteristics for a NAND flash memory device that includes two-terminal memory elements in accordance with certain embodiments of this disclosure.

Turning now to FIG. 9, method 900 is illustrated. Method 900 can provide for additional aspects or elements in connection with setting data command characteristics for a NAND flash memory device that includes two-terminal memory elements. At reference numeral 902, the memory controller detailed in connection with method 700 of FIG. 7 can receive a low-level NAND flash memory data operation command (e.g., low-level program, read, erase).

At reference numeral 904, the memory controller can translate the low-level NAND flash memory data operation command to a corresponding low-level two-terminal memory data operation command. Said differently, a NAND-based program or erase data operation command can be translated to a like command suitable for two-terminal memory.

At reference numeral 906, the memory controller can issue the low-level two-terminal memory data operation command to the two-terminal memory array. In some embodiments, and as described at reference numeral 908, the low-level NAND flash memory command can be a program page command and the corresponding low-level two-terminal data operation command comprises an instruction to overwrite a set of bits that is less than a number of bits defined by the program page command. In some embodiments, and as detailed at reference numeral 910, the low-level NAND flash memory command can be an erase block command and the corresponding low-level two-terminal data operation command comprises an instruction to overwrite a set of bits that is less than a number of bits defined by the erase block command. In other words, the corresponding command can set the translation for NAND-based page-write and block-erase commands to program/erase only the relevant bits rather than the entire page or block.

Figure 10:
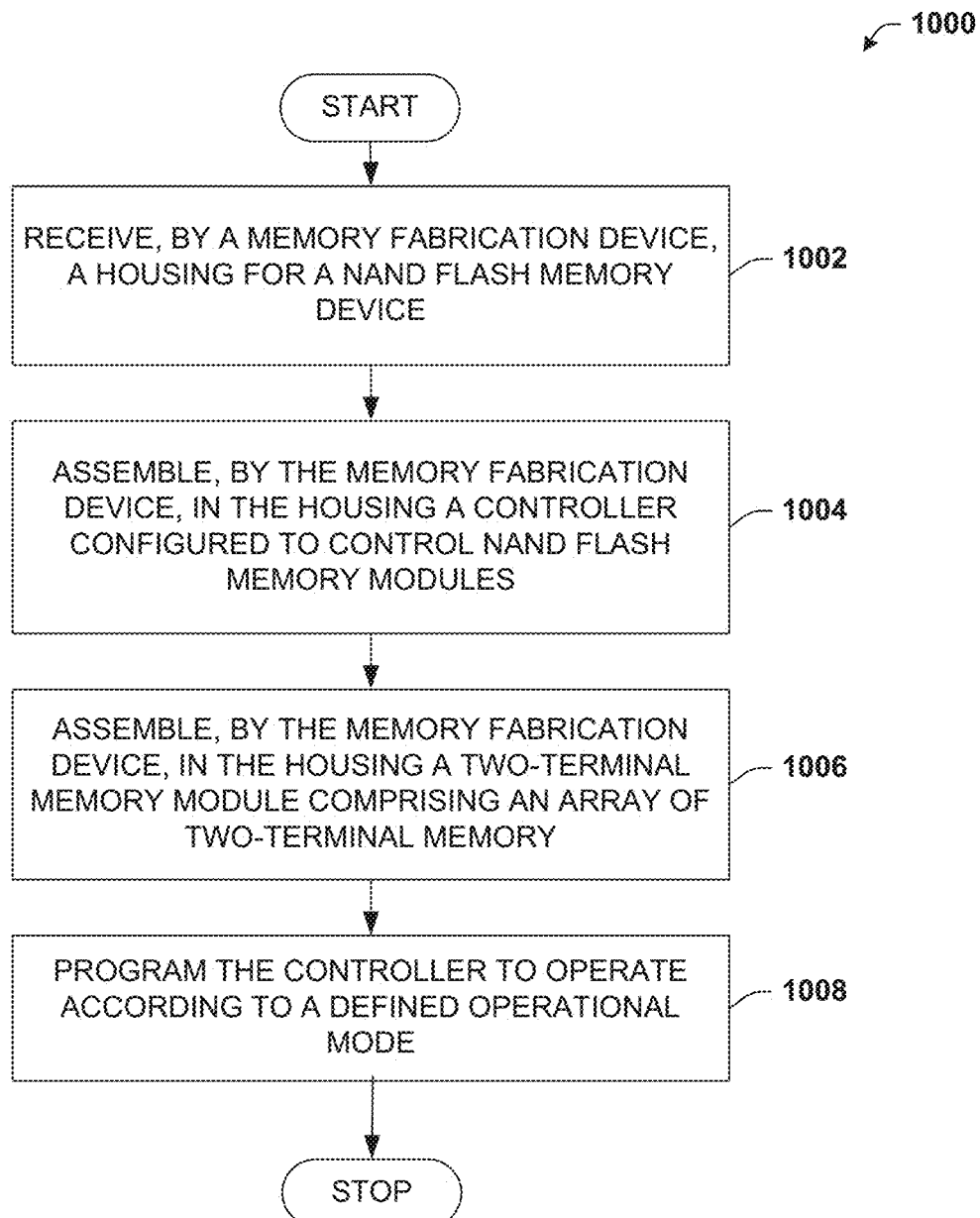
FIG. 10 illustrates an example methodology that can provide for assembly of a NAND-based memory device that utilizes two-terminal memory elements in accordance with certain embodiments of this disclosure.

FIG. 10 depicts method 1000. Method 1000 can provide for assembly of a NAND-based memory device that utilizes two-terminal memory elements. At reference numeral 1002, a memory fabrication device can receive a housing for a NAND flash memory device. At reference numeral 1004, the memory fabrication device can assemble, in the housing, a controller configured to control NAND flash memory modules.

At reference numeral 1006, the memory fabrication device can assemble, in the housing, a two-terminal memory module comprising an array of two-terminal memory cells. At reference numeral 1008, the controller can be programmed to operate according to a defined operational mode.

Example Operating Environments

Figure 11:
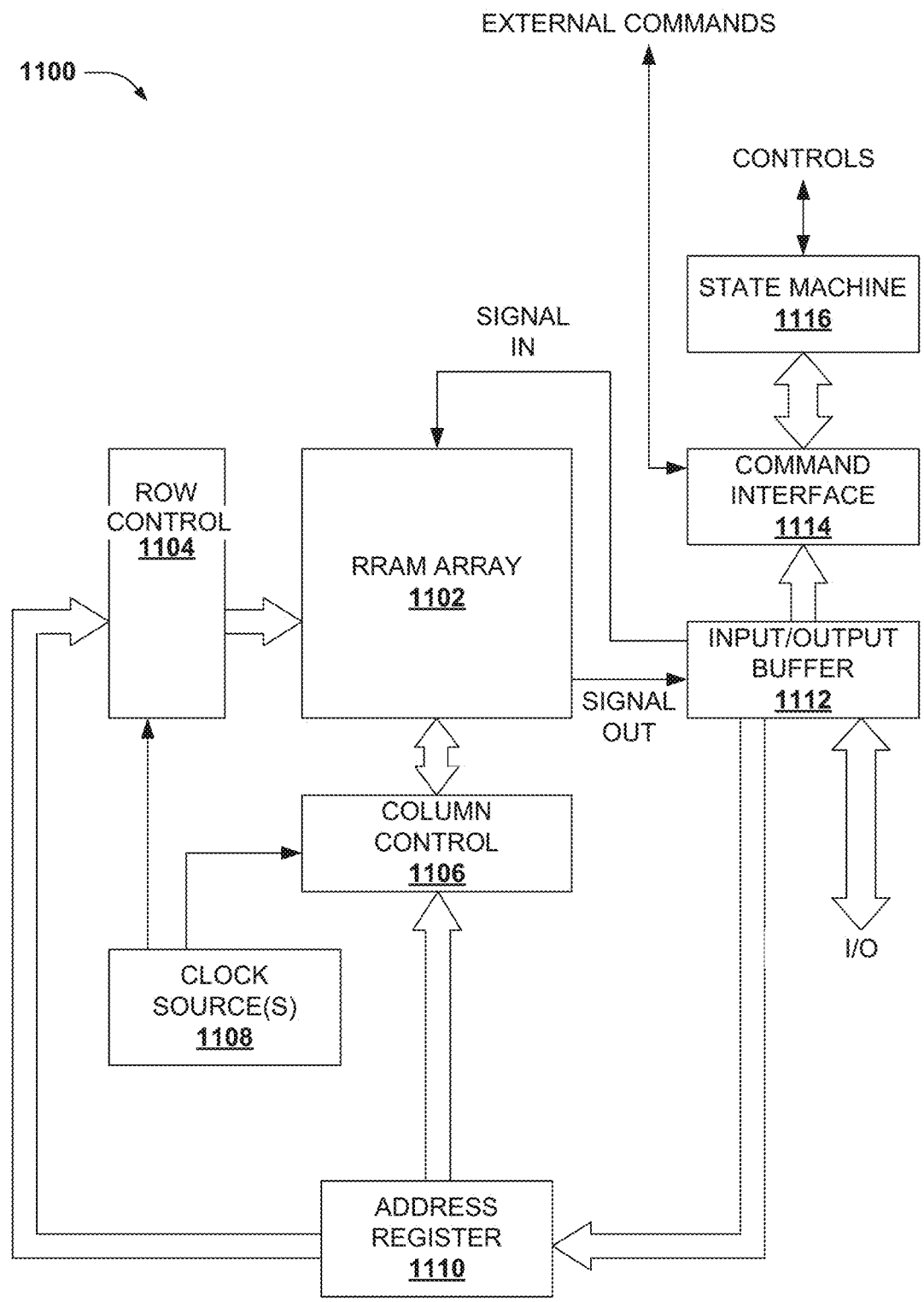
FIG. 11 illustrates a block diagram of an example electronic operating environment in accordance with certain embodiments of this disclosure.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 11 illustrates a block diagram of an example operating and control environment 1100 for a RRAM array 1102 according to aspects of the subject disclosure. In at least one aspect of the subject disclosure, RRAM array 1102 can comprise a variety of RRAM memory cell technology. Particularly, RRAM array can be configured or operated to mitigate or avoid sneak path currents of the RRAM array, as described herein.

A column controller 1106 can be formed adjacent to RRAM array 1102. Moreover, column controller 1106 can be electrically coupled with bit lines of RRAM array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of RRAM array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row control 1104 and column control 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to RRAM array 1102 via signal input lines, and output data is received from RRAM array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of RRAM array 1102. State machine 1116 receives commands from the host apparatus via input/output interface 1112 and command interface 1114, and manages read, write, erase, data input, data output, and like functionality associated with RRAM array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 12:
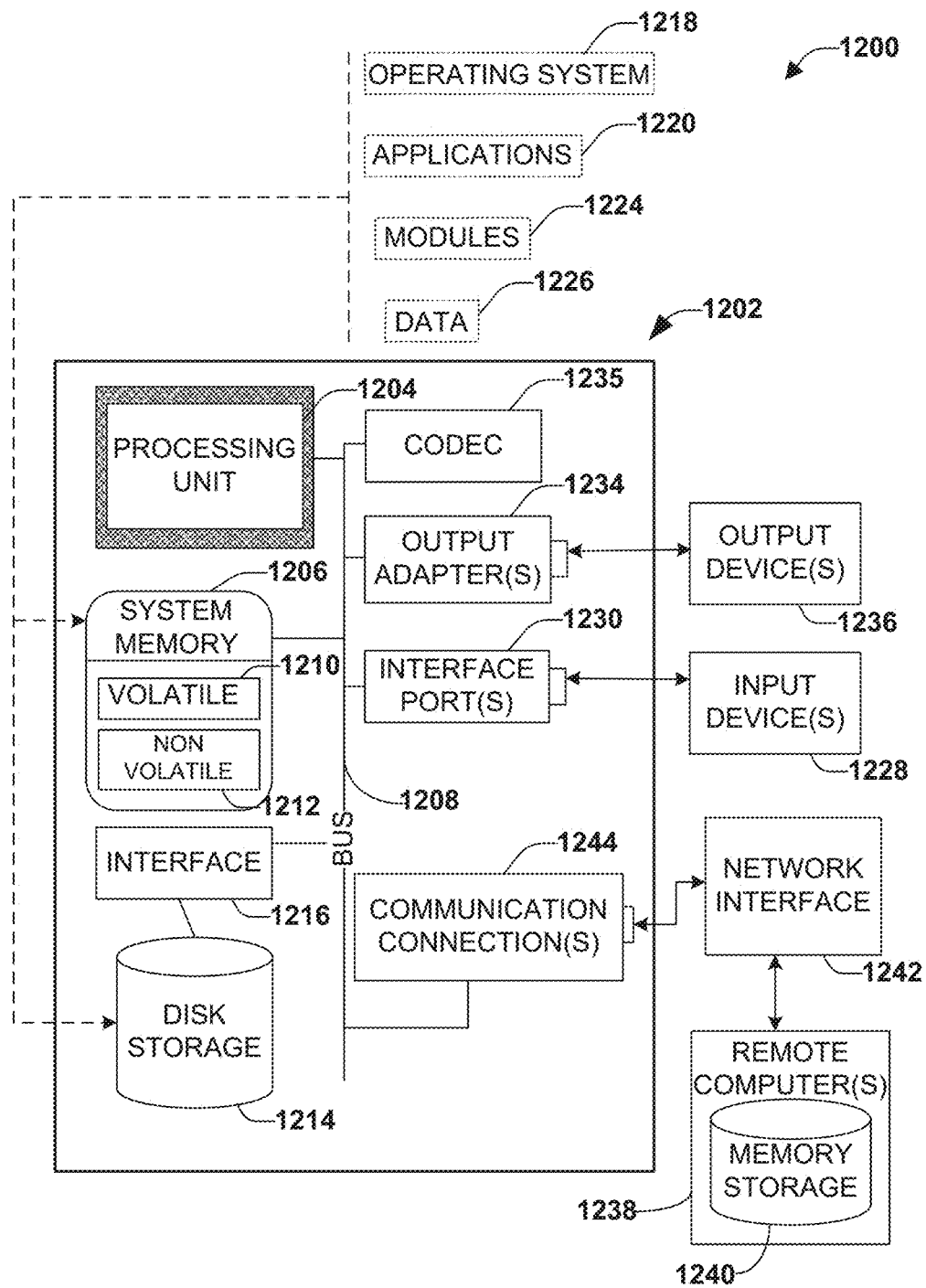
FIG. 12 illustrates a block diagram of an example computing environment in accordance with certain embodiments of this disclosure.

With reference to FIG. 12, a suitable environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1206 includes volatile memory 1210 and non-volatile memory 1212. The basic input/output system (BIOS), containing the basic routines to transfer information between elements within the computer 1202, such as during start-up, is stored in non-volatile memory 1212. In addition, according to present innovations, codec 1235 may include at least one of an encoder or decoder, wherein the at least one of an encoder or decoder may consist of hardware, software, or a combination of hardware and software. Although, codec 1235 is depicted as a separate component, codec 1235 may be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), or flash memory. Volatile memory 1210 includes random access memory (RAM), which acts as external cache memory. According to present aspects, the volatile memory may store the write operation retry logic (not shown in FIG. 12) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1202 may also include removable/non-removable, volatile/non-volatile computer storage medium. FIG. 12 illustrates, for example, disk storage 1214. Disk storage 1214 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1214 to the system bus 1208, a removable or non-removable interface is typically used, such as interface 1216. It is appreciated that storage devices 1214 can store information related to a user. Such information might be stored at or provided to a server or to an application running on a user device. In one embodiment, the user can be notified (e.g., by way of output device(s) 1236) of the types of information that are stored to disk storage 1214 and/or transmitted to the server or application. The user can be provided the opportunity to opt-in or opt-out of having such information collected and/or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer system 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port may be used to provide input to computer 1202 and to output information from computer 1202 to an output device 1236. Output adapter 1234 is provided to illustrate that there are some output devices 1236 like monitors, speakers, and printers, among other output devices 1236, which require special adapters. The output adapters 1234 include, by way of illustration and not limitation, video and sound cards that provide a means of connection between the output device 1236 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1244 refers to the hardware/software employed to connect the network interface 1242 to the bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:
1. A memory device, comprising:
one or more memory modules comprising an array of non-volatile two-terminal memory cells;
a memory command input interface; and
a module controller and translator (MCT) configured to:
activate or deactivate a NAND emulation mode in response to an activation command, wherein the NAND emulation mode, in response to a NAND flash memory command, performs a low-level memory operation on a subset of the non-volatile two-terminal memory cells that at least in part emulates a function associated with the NAND flash memory command; and set a two-terminal memory operational characteristic for the one or more memory modules in response to a configuration command received over the memory command input interface for setting a NAND operational characteristic for NAND flash memory, wherein the configuration command relates to a Feature parameter that is set according to a Set Features command, and the Set Features command relates to an overwrite capability supported by the two-terminal memory cells, wherein the overwrite capability is characterized by updating a current state associated with a memory cell independently of the current state.

2. The memory device of claim 1, wherein the configuration command is received from a host device over the memory command input interface.

3. The memory device of claim 1, wherein the MCT is further configured to translate a low-level NAND flash memory data operation command to a corresponding low-level two-terminal memory data operation command.

4. The memory device of claim 3, wherein the low-level NAND flash memory data operation command is a program page command or an erase block command and the corresponding low-level two-terminal memory data operation command is an overwrite command.

5. The memory device of claim 4, wherein the overwrite command applies to at least one bit included in a page of memory defined by the program page command without overwriting other bits included in the page of memory, or included in a block of memory defined by the erase block command without overwriting other bits included in the block of memory.

6. The memory device of claim 1, wherein the configuration command relates to a mode of operation for the NAND flash memory, wherein the mode of operation conforms to a defined set of NAND operational characteristics including the NAND operational characteristic.

7. The memory device of claim 1, wherein the configuration command relates to at least one of timing characteristics, voltage characteristics, current characteristics, or other electrical characteristics.

8. The memory device of claim 1, wherein the Set Features command further relates to a vendor specific Feature parameter.

9. The memory device of claim 1, wherein the Set Features command further relates to a page erase capability supported by the two-terminal memory cells, wherein the page erase capability is characterized by setting two-terminal memory cells included in a logical page of memory to a defined state, wherein the defined state is associated with a specific bit value.

10. The memory device of claim 1, wherein the MCT issues multiple page erase commands that emulates a NAND-based block erase command in response to the Set Features command being activated.

11. The memory device of claim 1, wherein the Set Features command further relates to a configurable page size capability supported by the two-terminal memory cells.

12. The memory device of claim 1, wherein the Set Features command further relates to a configurable garbage collection functionality.

13. The memory device of claim 1, wherein the Set Features command further relates to a configurable error correcting code (ECC) functionality.

14. The memory device of claim 1, wherein the Set Features command further relates to a configurable block management functionality.

15. The memory device of claim 1, wherein the Set Features command further relates to a configurable multi-level cell (MLC) pagination functionality.

16. A method, comprising:
receiving, by a command interface, a configuration command for NAND flash memory;
identifying, by a memory controller, a setting associated with a NAND characteristic for controlling an operational characteristic of NAND flash memory related to the configuration command;
determining, by the memory controller, a corresponding setting associated with a two-terminal memory characteristic for controlling an operational characteristic of a two-terminal memory array; and
configuring, by the memory controller, a memory device that comprises the two-terminal memory array according to the corresponding setting and in response to the configuration command for NAND flash memory; and
configuring, by the memory controller, the memory device according to the corresponding setting, wherein the corresponding setting relates to an overwrite capability supported by the two-terminal memory array characterized by updating a current state of a cell of the two-terminal memory array independently of the current state.

17. The method of claim 16, wherein the corresponding setting further relates to a sub-block erase capability characterized by erasing fewer bits than are defined for a block of memory.

18. The method of claim 16, wherein the corresponding setting further relates to a configurable page size capability supported by the two-terminal memory array.

19. The method of claim 16, wherein the corresponding setting further relates to a configurable garbage collection capability supported by the two-terminal memory array.

20. The method of claim 16, further comprising:
receiving, by the memory controller, a low-level NAND flash memory data operation command;
translating, by the memory controller, the low-level NAND flash memory data operation command to a corresponding low-level two-terminal memory data operation command; and
issuing, by the memory controller, the corresponding low-level two-terminal memory data operation command to the two-terminal memory array.

21. The method of claim 20, wherein the low-level NAND flash memory data operation command is a program page command and the corresponding low-level two-terminal memory data operation command comprises an instruction to overwrite a set of bits that is less than a number of bits defined by the program page command.

22. The method of claim 20, wherein the low-level NAND flash memory data operation command is an erase block command and the corresponding low-level two-terminal memory data operation command comprises an instruction to overwrite a set of bits that is less than a number of bits defined by the erase block command.

23. A memory device, comprising:
one or more memory modules comprising an array of non-volatile two-terminal memory cells;
a memory command input interface; and
a module controller and translator (MCT) configured to:
activate or deactivate a NAND emulation mode in response to an activation command, wherein the NAND emulation mode, in response to a NAND flash memory command, performs a low-level memory operation on a subset of the non-volatile two-terminal memory cells that at least in part emulates a function associated with the NAND flash memory command; and set a two-terminal memory operational characteristic for the one or more memory modules in response to a configuration command received over the memory command input interface for setting a NAND operational characteristic for NAND flash memory, wherein the configuration command relates to a Feature parameter that is set according to a Set Features command, and the Set Features command relates to a configurable page size capability supported by the two-terminal memory cells.

24. The memory device of claim 23, wherein the Set Features command relates to an overwrite capability supported by the two-terminal memory cells, wherein the overwrite capability is characterized by updating a current state associated with a memory cell independently of the current state.

25. The memory device of claim 23, wherein the Set Features command further relates to a page erase capability supported by the two-terminal memory cells, wherein the page erase capability is characterized by setting two-terminal memory cells included in a logical page of memory to a defined state, wherein the defined state is associated with a specific bit value.

26. The memory device of claim 23, wherein the Set Features command further relates to a configurable garbage collection functionality.

27. The memory device of claim 23, wherein the Set Features command further relates to a configurable error correcting code (ECC) functionality.

28. The memory device of claim 23, wherein the Set Features command further relates to a configurable block management functionality.

29. The memory device of claim 23, wherein the Set Features command further relates to a configurable multi-level cell (MLC) pagination functionality.

* * * * *